US007265161B2

(12) United States Patent
Leatherdale et al.

(10) Patent No.: US 7,265,161 B2
(45) Date of Patent: *Sep. 4, 2007

(54) MULTI-PHOTON REACTIVE COMPOSITIONS WITH INORGANIC PARTICLES AND METHOD FOR FABRICATING STRUCTURES

(75) Inventors: Catherine A. Leatherdale, St. Paul, MN (US); Craig R. Schardt, St. Paul, MN (US); D. Scott Thompson, Woodbury, MN (US); Wendy L. Thompson, Roseville, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/262,927

(22) Filed: Oct. 2, 2002

(65) Prior Publication Data

US 2004/0068023 A1    Apr. 8, 2004

(51) Int. Cl.
| G03F 7/016 | (2006.01) |
| G03F 7/028 | (2006.01) |
| G03F 7/029 | (2006.01) |
| G03C 1/725 | (2006.01) |
| C08K 3/20  | (2006.01) |
| C08K 3/35  | (2006.01) |

(52) U.S. Cl. ................ 522/25; 522/26; 522/81; 522/83

(58) Field of Classification Search .......... 522/83, 522/81, 79, 84, 85, 170, 172, 173, 182, 25, 522/26, 28, 7
See application file for complete search history.

(56) References Cited

U.S. PATENT DOCUMENTS

| 2,801,185 | A | 7/1957 | Iler |
| 3,018,262 | A | 1/1962 | Schroeder |
| 3,117,099 | A | 1/1964 | Proops et al. |
| 3,502,520 | A | 3/1970 | Schwartz |
| 3,729,313 | A | 4/1973 | Smith |
| 3,741,769 | A | 6/1973 | Smith |
| 3,808,006 | A | 4/1974 | Smith |
| 4,250,053 | A | 2/1981 | Smith |
| 4,279,717 | A | 7/1981 | Eckberg et al. |
| 4,394,403 | A | 7/1983 | Smith |
| 4,491,628 | A | 1/1985 | Ito et al. |
| 4,522,958 | A | 6/1985 | Das et al. |
| 4,642,126 | A | 2/1987 | Zador et al. |
| 4,652,274 | A | 3/1987 | Boettcher et al. |
| 4,859,572 | A | 8/1989 | Farid et al. |
| 4,963,471 | A | 10/1990 | Trout et al. |
| 4,970,135 | A | 11/1990 | Kushi et al. |
| 5,032,478 | A | 7/1991 | Nebe et al. |
| 5,032,490 | A | 7/1991 | Nebe et al. |
| 5,047,313 | A | 9/1991 | Nebe et al. |
| 5,235,015 | A | 8/1993 | Ali et al. |
| 5,307,438 | A | 4/1994 | Bilkadi et al. |
| 5,436,279 | A | 7/1995 | Grundke et al. |
| 5,496,682 | A | 3/1996 | Quadir et al. |
| 5,545,676 | A | 8/1996 | Palazzotto et al. |
| 5,648,407 | A | 7/1997 | Goetz et al. |
| 5,753,346 | A | 5/1998 | Leir et al. |
| 5,770,737 | A | 6/1998 | Reinhardt et al. |
| 5,856,373 | A | 1/1999 | Kaisaki et al. |
| 5,859,251 | A | 1/1999 | Reinhardt et al. |
| 5,998,495 | A | 12/1999 | Oxman et al. |
| 6,025,406 | A | 2/2000 | Oxman et al. |
| 6,100,405 | A | 8/2000 | Reinhardt et al. |
| 6,267,913 | B1 * | 7/2001 | Marder et al. ............... 252/582 |
| 6,291,145 | B1 * | 9/2001 | Kokubo et al. ............. 430/394 |
| 6,316,153 | B1 * | 11/2001 | Goodman et al. ............ 430/8 |
| 6,455,103 | B1 | 9/2002 | Mennig et al. |
| 6,512,606 | B1 * | 1/2003 | Lipson et al. .................... 359/3 |
| 6,593,392 | B2 * | 7/2003 | Wang .......................... 522/83 |
| 6,624,915 | B1 * | 9/2003 | Kirkpatrick et al. ............ 359/3 |
| 6,656,990 | B2 * | 12/2003 | Shustack et al. ............. 524/430 |
| 6,682,872 | B2 * | 1/2004 | Sachdev et al. ............. 430/311 |
| 6,750,266 | B2 * | 6/2004 | Bentsen et al. ................. 522/2 |
| 6,852,766 | B1 * | 2/2005 | DeVoe .......................... 522/25 |
| 7,005,229 | B2 | 2/2006 | Nirmal et al. |
| 7,008,749 | B2 * | 3/2006 | Gonsalves ............... 430/270.1 |

(Continued)

FOREIGN PATENT DOCUMENTS

EP    0 432 907    6/1991

(Continued)

OTHER PUBLICATIONS

R. D. Allen, G. M. Wallraff, W. D. Hinsberg, and L. L. Simpson in "High Performance Acrylic Polymers for Chemically Amplified Photoresist Applications," J. Vac. Sci. Technol. B, 9, 3357 (1991).
R. D Allen et al. in Proc. SPIE 2438, 474-477 (1995).
C. Xu and W. W. Webb in J. Opt. Soc. Am. B, 13, 481-491(1996).
I. B. Berlman in *Handbook of Fluorescence Spectra of Aromatic Molecules*, Second Edition, pp. 24-27, Academic Press, New York (1971).
J. N. Demas and G. A. Crosby in J. Phys. Chem. 75, 991-1024 (1971).
J. V. Morris, M. A. Mahoney, and J. R. Huber in J. Phys. Chem. 80, 969-974 (1976).
Beringer et al., J. Am. Chem. Soc. 81, 342-351 (1959).

(Continued)

*Primary Examiner*—Susan Berman
(74) *Attorney, Agent, or Firm*—H. Sanders Gwin; David R. Cleveland; Lucy C. Weiss

(57) ABSTRACT

A multi-photon reactive composition including: (a) at least one reactive species; and (b) multi-photon photoinitiator system; and (c) a plurality of substantially inorganic particles, wherein the particles have an average particle size of less than about 10 microns in diameter.

22 Claims, 3 Drawing Sheets

U.S. PATENT DOCUMENTS

| | | | |
|---|---|---|---|
| 7,026,103 B2* | 4/2006 | DeVoe et al. | 430/333 |
| 7,060,419 B2* | 6/2006 | Bentsen et al. | 430/320 |
| 2002/0001763 A1 | 1/2002 | Yasuno et al. | |
| 2003/0019517 A1 | 1/2003 | McFarland | |
| 2003/0139484 A1* | 7/2003 | Bentsen et al. | 522/2 |
| 2003/0155667 A1* | 8/2003 | Devoe et al. | 264/1.27 |
| 2004/0067431 A1* | 4/2004 | Arney et al. | 430/138 |
| 2004/0067433 A1* | 4/2004 | Nirmal et al. | 430/270.01 |
| 2004/0067450 A1 | 4/2004 | Leatherdale et al. | |
| 2004/0067451 A1* | 4/2004 | DeVoe et al. | 430/322 |
| 2004/0079195 A1* | 4/2004 | Perry et al. | 75/345 |
| 2005/0054744 A1* | 3/2005 | DeVoe | 522/1 |

FOREIGN PATENT DOCUMENTS

| | | |
|---|---|---|
| EP | 0 977 212 A2 | 2/2000 |
| WO | WO98/21521 | 5/1998 |
| WO | WO99/53242 | 10/1999 |
| WO | WO 00/73241 | 12/2000 |
| WO | WO 01/96409 | 12/2001 |
| WO | WO 01/96452 | 12/2001 |
| WO | WO 01/96915 | 12/2001 |
| WO | WO 01/96917 | 12/2001 |
| WO | WO 01/96952 | 12/2001 |
| WO | WO 01/96958 | 12/2001 |
| WO | WO 01/96959 | 12/2001 |
| WO | WO 01/96961 | 12/2001 |
| WO | WO 01/96962 | 12/2001 |
| WO | WO 02/079691 | 10/2002 |

OTHER PUBLICATIONS

Bull. Chem. Soc. Japan, 42, 2924-2930 (1969).

R. J. Cox, *Photographic Sensitivity*, Chapter 15, Academic Press (1973).

D. F. Eaton "Advances in Photochemistry", edited by B. Voman et al., vol. 13, pp. 427-488, John Wiley and Sons, New York (1986).

R. A. Andrievsky, "State-of-the-art and perspective in the field of particulate nanostructured materials," J. Mater Sci. Technol. 14, 97 (1998).

L.L. Beecroft et al., "Nanocomposite Materials for Optical Applications" Chem. Mater. 1997, pp. 1302-1317.

Belfield et al. "Multiphoton-absorbing organic Materials for Microfabrication, emerging optical applications and non-destructive three-dimensional imaging" J.Phys. Org. Chem. 2000, 13: pp. 837-849.

MEMES-vol. 2, Micro-Electro-Mechanical Systems-2000 "Optically-Driven Microstructures Fabricated by Two-Photon Microstereolithography", pp. 695-699.

Macromolecules, vol. 33, No. 16, 2000, "Communication to the Editor", pp. 5751-5753.

Stellacci et al., Adv. Mater. vol. 14, No. 3, "Laser and Electron-Beam Induced Growth of Nanoparticles for 2D and 3D Metal Patterning" pp. 194-198.

U.S. Appl. No. 10/033507, filed Dec. 28, 2001 Multiphoton Photosensitization System.

Cumpston et al., Two-Photon Polymerization Initiators for Three-Dimensional Optical Data Storage and Microfabrication, *Nature*, vol. 398, Mar. 4, 1999, pp. 51-54, XP002270322.

Stellacci et al., One- and Two-Photon Induced Growth of Ligand Coated Nanoparticles for 2 & 3D Metal Patterning, *Proc. SPIE*, vol. 4809, Jul. 9, 2002, pp. 62-68, XP002270320.

Wu et al., Two-Photon Photographic Production of Three-Dimensional Metallic Structures Within a Dielectric Matrix, *Advanced Materials*, vol. 12, No. 19, Oct. 2, 2000, pp. 1438-1441, XP002270323.

Zhou et al., An Efficient Two-Photon-Generated Photoacid Applied to Positive-Tone 3D Microfabrication, *Science*, vol. 296, May 10, 2002, pp. 1106-1109, XP002270321.

Lakowicz et al, "Emission Spectral Properties of Cadmium Sulfide Nanoparticles with Multiphoton Excitation", J. Phys. Chem. B. 106. 5365-5370, 2002 XP-002316823.

Stellacci et al., Adv. Mater. vol. 14, No. 3, "Laser and Electron-Beam Induced Growth of Nanoparticles for 2D and 3D Metal Patterning" pp. 194-198, Feb. 2002.

* cited by examiner

MULTI-PHOTON REACTIVE COMPOSITIONS WITH INORGANIC PARTICLES AND METHOD FOR FABRICATING STRUCTURES

TECHNICAL FIELD

This invention relates to multi-photon reactive compositions and methods for fabricating structures that include inorganic particles with a multi-photon curing process.

BACKGROUND

Multi-photon induced photo-polymerization provides a means to fabricate three-dimensional devices with exquisite sub-micron resolution in a single processing step. Multi-photon processes involve the simultaneous absorption of two or more photons by an absorbing chromophore. The total energy of the absorbed photons equals the energy of a multi-photon absorption peak, even though each photon individually has insufficient energy to excite the chromophore. Whereas single-photon absorption scales linearly with the intensity of the incident radiation, two-photon absorption scales quadratically. Higher-order absorptions scale with a related higher power of incident intensity. As a result, it is possible to perform multi-photon curing processes with three-dimensional spatial resolution. Furthermore, the excitation radiation is not attenuated by single-photon absorption within a reactive matrix or material, so it is possible to selectively excite molecules at a greater depth within a material than would be possible via single-photon excitation.

Multi-photon fabrication can be used to manufacture mechanical and optical devices, such as cantilevers, gears, shafts, and microlenses. Thus far, however, the technique has been limited to organic polymers. There are many applications where the mechanical, electrical, thermal, and/or optical properties of conventional polymer systems can be inappropriate for the end device use. In other cases, suitable polymer systems can be available, but not easily amenable to photoimaging. In certain applications, there is a need to enhance the physical properties of the completed structures without significantly changing the imaging mechanism.

SUMMARY

Addition of inorganic nanoparticles to the reactive composition allows tailoring of the optical, thermal, mechanical, and dielectric properties of the nanocomposite, while maintaining the speed, easy processing, and flexible chemistry provided by the organic components of the composition. Following exposure and development, the completed structure can be left as is or can be pyrolyzed to remove the organic components and leave a substantially inorganic structure. The long wavelength infrared light used for multi-photon imaging undergoes minimal scattering, and therefore, little loss of imaging resolution.

Resins with uniformly dispersed, non-aggregated particles can be photopatterned in accordance with the method of the invention to achieve high resolution features with little resolution loss due to scattering. The invention provides a method to manufacture three dimensional inorganic structures without requiring any molding or embossing steps, circumventing the difficulties associated with the de-molding process of structures with micron size dimensions.

In one aspect, the invention relates to a multi-photon reactive composition including at least one reactive species, a multi-photon photoinitiator system, and a plurality of substantially inorganic particles, wherein the particles have an average particle size of less than about 10 microns in diameter. As used herein, the "diameter" refers not only to the diameter of substantially spherical particles but also to the longest dimension of non-spherical particles.

In a second aspect, the invention relates to an article including an at least partially reacted species, a multi-photon photoinitiator system, and a plurality of substantially inorganic particles, wherein the particles have an average particle size of less than about 10 microns in diameter, and the particles are present in the composition at up to about 65% by volume.

In a third aspect, the invention provides a method for making an organic-inorganic composite including:
(a) providing a multi-photon reactive composition including:
  (1) a reactive species,
  (2) a multi-photon photoinitiator system,
  (3) and a plurality of substantially inorganic particles,
wherein the particles have an average particle size of less than about 10 microns in diameter; and
(b) irradiating the multi-photon reactive composition with sufficient light to at least partially react the composition; and (c) removing a soluble portion of the multi-photon reactive composition from the resulting composite. As used herein, the term "sufficient light" means light of sufficient intensity and appropriate wavelength to effect multiphoton absorption.

DESCRIPTION OF DRAWINGS

Like reference symbols in the various drawings indicate like elements.

DETAILED DESCRIPTION

Exposure System and Conditions

Figure 1:
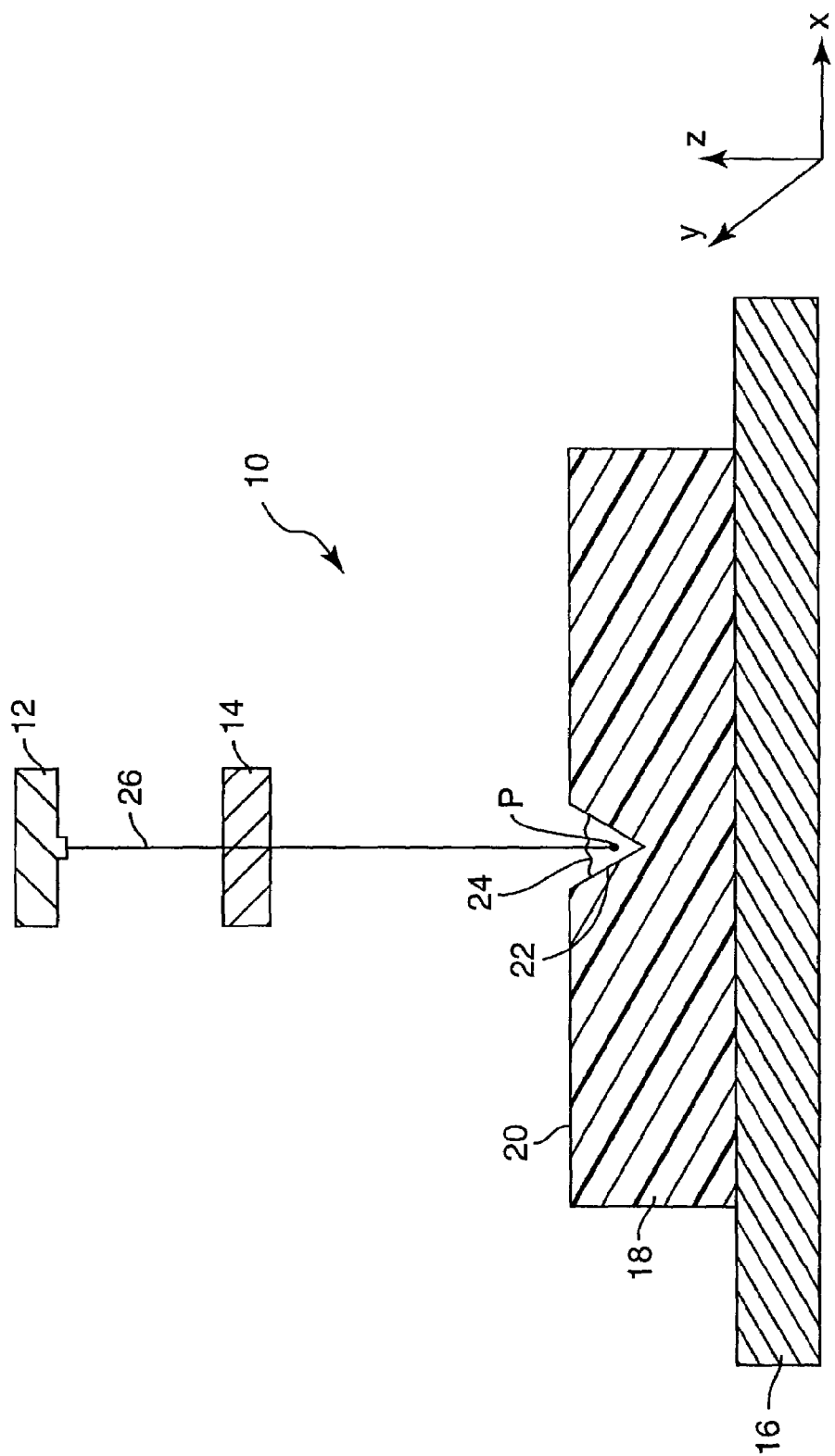
FIG. 1 is a schematic representation of a multi-photon curing apparatus.

Referring to FIG. 1, an optical system 10 for use in the invention includes a light source 12, an optical element 14, and a moveable stage 16. The stage 16 is preferably moveable in three dimensions. A partially completed article 18 mounted on the stage 16 includes a surface 20 and an optional surface feature 22. A multi-photon-reactive composition 24 is applied on the surface 20 or in the feature 22. The light 26 originating from the light source 12 is then focused to a point P within the volume of the reactive composition 24 to control the three-dimensional spatial distribution of light intensity within the composition to at least partially react the composition 24.

Generally, light from a pulsed laser can be passed through a focusing optical train to focus the beam within the volume of the reactive composition 24. Using the stage 16, or by moving the light source 12 (for example, moving a laser beam using galvo-mirrors), the focal point P can be scanned or translated in a three-dimensional pattern that corresponds to a desired shape. The reacted or partially reacted portion of the reactive composition 24 then creates a three-dimensional structure of a desired shape.

The light source 12 in the system 10 can be any light source that produces sufficient intensity to effect multi-photon absorption. Suitable sources include, for example, femtosecond near-infrared titanium sapphire oscillators (for example, those available from Coherent under the trade designation MIRA OPTIMA 900-F) pumped by an argon ion laser (for example, those available from Coherent under the trade designation INNOVA). This laser, operating at 76 MHz, has a pulse width of less than 200 femtoseconds, is tunable between 700 and 980 nm, and has average power up to 1.4 Watts (for example, a Spectra-Physics, Inc., (1335 Terra Bella Avenue, Mountain View, Calif. 94043 USA) "Mai Tai" model, operated at a wavelength $\lambda$=800 nm, a repetition frequency of 80 MHz, and a pulse width of about 100 femtoseconds ($1\times10^{-13}$ sec), with a power level up to 1 Watt).

However, in practice, any light source that provides sufficient intensity (to effect multi-photon absorption) at a wavelength appropriate for the photosensitizer (used in the photoreactive composition) can be utilized. Such wavelengths can generally be in the range of about 300 to about 1500 nm; preferably, from about 600 to about 1100 nm; more preferably, from about 750 to about 850 nm. Peak intensities can generally be from about $10^6$ W/cm². The upper limit on pulse fluence is generally dictated by the ablation threshold of the photoreactive composition. For example, Q-switched Nd:YAG lasers (for example, those available from Spectra-Physics under the trade designation QUANTA-RAY PRO), visible wavelength dye lasers (for example, those available from Spectra-Physics under the trade designation SIRAH pumped by a Spectra-Physics Quanta-Ray PRO), and Q-switched diode pumped lasers (for example, those available from Spectra-Physics under the trade designation FCBAR) can also be utilized. Preferred light sources are near infrared pulsed lasers having a pulse length less than about $10^{-8}$ second (more preferably, less than about $10^{-9}$ second; most preferably, less than about $10^{-11}$ second). Other pulse lengths can be used as long as the peak intensity and ablation threshold criteria above are met. Continuous wave lasers can also be utilized.

Optical elements 14 useful in the system 10 include, for example, refractive optical elements (for example, lenses), reflective optical elements (for example, retroreflectors or focusing mirrors), diffractive optical elements (for example, gratings, phase masks, and holograms), polarizing optical elements (for example, linear polarizers and waveplates), diffusers, Pockels cells, waveguides, and the like. Such optical elements are useful for focusing, beam delivery, beam/mode shaping, pulse shaping, and pulse timing. Generally, combinations of optical elements can be utilized, and other appropriate combinations will be recognized by those skilled in the art. It is often desirable to use optics with large numerical aperture (NA) to provide highly-focused light. However, any combination of optical elements that provides a desired intensity profile (and spatial placement thereof) can be utilized. For example, the exposure system can include a scanning confocal microscope (for example, those available from BioRad under the trade designation MRC600) equipped with a 0.75 NA objective (such as, for example, those available from Zeiss under the trade designation 20X FLUAR).

Exposure times generally depend upon the type of exposure system used to cause image formation (and its accompanying variables such as numerical aperture, geometry of light intensity spatial distribution, the peak light intensity during the laser pulse (higher intensity and shorter pulse duration roughly correspond to peak light intensity)), as well as upon the nature of the multi-photon reactive composition exposed. Generally, higher peak light intensity in the regions of focus allows shorter exposure times, everything else being equal. Linear imaging or "writing" speeds generally can be about 5 to 100,000 microns/second using a laser pulse duration of about $10^{-8}$ to $10^{-15}$ second (preferably, about $10^{-11}$ to $10^{-14}$ second) and about $10^2$ to $10^9$ pulses per second (preferably, about $10^3$ to $10^8$ pulses per second).

The multi-photon reactive radiation 26 induces a reaction in the reactive composition that produces a material having solubility characteristics different from those of the unexposed reactive composition. The resulting pattern of exposed and unexposed material can then be developed by removing either the exposed or the unexposed regions with an appropriate solvent. An optional post exposure bake following exposure but prior to development may be required for photoreactive compositions containing epoxy type reactive species. Reacted, Complex, seamless three-dimensional structures can be prepared in this manner.

The resulting structures can have any suitable size and shape, but the method of the invention is particularly well suited for adding a microstructure to a microstructured surface of an article. The structures can be formed on the surface of the article, or within or on a feature of the surface. Where such feature(s) exist on the surface of an article, for example, continuous or discontinuous patterns of depressions, protrusions, posts, or channels, the structures can be formed in the feature(s). The feature(s) can be microscopic, where the term "microscopic" refers to features of small enough dimension so as to require an optic aid to the naked eye when viewed from any plane of view to determine its shape. One criterion is found in *Modern Optic Engineering* by W. J. Smith, McGraw-Hill, 1966, pages 104-105 whereby visual acuity, " . . . is defined and measured in terms of the angular size of the smallest character that can be recognized." Normal visual acuity is considered to be when the smallest recognizable letter subtends an angular height of 5 minutes of arc on the retina. At typical working distance of 250 mm (10 inches), this yields a lateral dimension of 0.36 mm (0.0145 inch) for this object. As used herein, the term "microstructure" means the configuration of features wherein at least 2 dimensions of the features are microscopic.

Figure 2A:
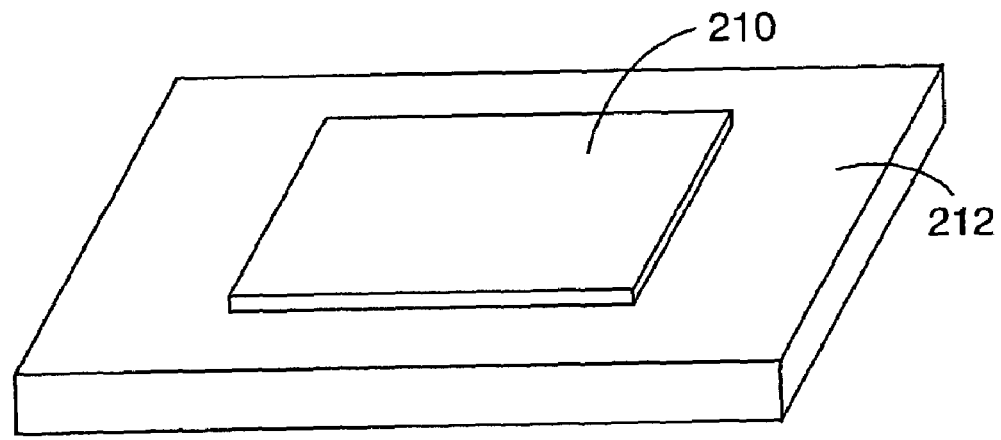
FIGS. 2A and 2B are a schematic representation of a method of preparing a three dimensional lattice structure having undercuts.
Figure 2B:
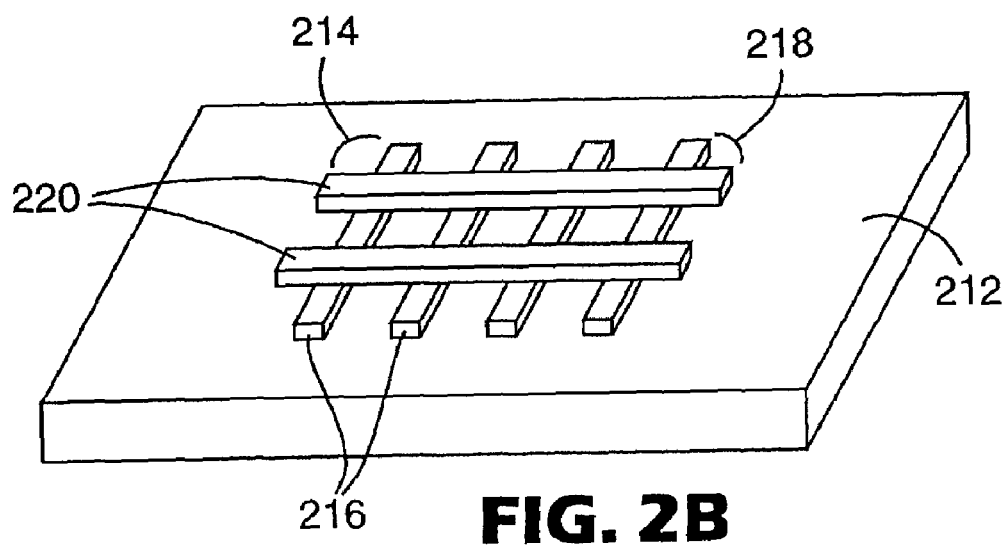

Referring to FIG. 2A and FIG. 2B, a reactive composition 210 can be applied to a substrate 212, such as a glass slide or silicon wafer. The substrate can optionally be treated with a primer (for example, a silane coupling agent) to enhance adhesion of the reactive composition to the substrate. A lattice-like pattern 218 can be formed by exposing the reactive composition 210 to form a series of layers 214 each having a series of closely spaced bars 216, wherein the bars 216 of one layer are orthogonal to the bars 220 of the neighboring layer.

The photopatterned structure 218 is then pyrolyzed to preferably remove substantially all the organic components (not shown in FIG. 2B). Typical pyrolysis conditions include heating the structure at 1° C./min to a temperature of between about 500° C. to about 900° C. and holding at a temperature in that range for about 60 to about 240 minutes.

Following pyrolysis, the three-dimensional pyrolyzed structure is substantially inorganic and partially sintered, with voids defined by the size and shape of the particles. Preferably, the three-dimensional structure includes solid close packed spheres. In some applications, it can be desirable to leave the structure partially porous (e.g., to allow flow of liquid through the pores). In other applications, the porous structure can be sintered further to yield a fully consolidated inorganic sintered structure.

Typical sintering conditions include heating the pyrolyzed structure to a temperature of between about 900° C. to about 1400° C. and holding at a temperature in that range for about 2 hours to about 48 hours. To aid in the consolidation process, the porous, pyrolyzed structures can be doped with a variety of materials, such as metal salts or other fluxing agents, such as, for example, boron oxide, boric acid, borax, and sodium phosphate. Alternatively, sol-gel precursors, such as tetraethoxygermanium and tetraethoxysilane, can be imbibed into the pores to aid in reducing the porosity and/or adding functionality to the device (for example, increasing refractive index). Doping of these porous structures with fluxing agents and/or sol-gel precursors followed by further sintering allows for the production of fully consolidated inorganic structures. In addition, other materials such as organometallic precursors can be added to the porous pyrolyzed structure to impart additional properties and/or function to the fabricated device.

After sintering, the structure has a substantially inorganic composition and dimensions that are smaller than prior to the sintering step. A narrow size distribution of particles sizes is also beneficial for achieving uniform sintering.

Figure 3A:
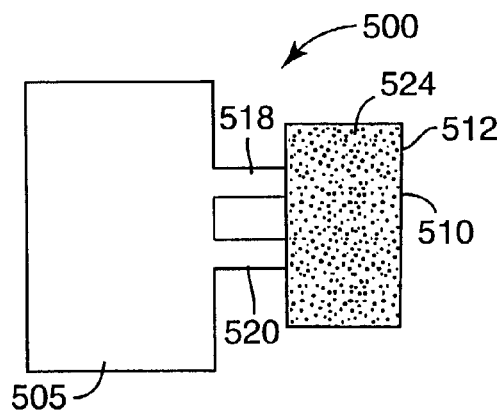
FIG. 3A shows a top view of a magnetic actuator that can be made using the composition of the invention.
Figure 3B:
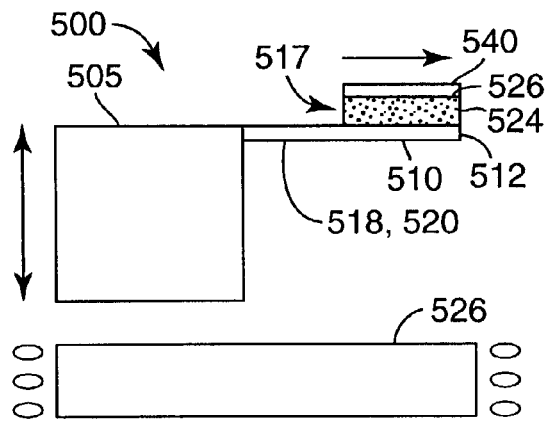
FIG. 3B shows a side view of a magnetic actuator that can be made using the composition of the invention.

Referring to FIGS. 3A and 3B, a curable embodiment of the composition can also be used to fabricate movable parts on a molded or photopatterned article (e.g., a magnetic actuator) that can be moved using an external energy source or an applied field (e.g., magnetic or electric field). Referring to FIG. 3A and FIG. 3B, a molded or photopatterned part 500 is shown having a body 505 and a flexible extension region 512 that is connected to the part 500 by two flexible prongs 518 and 520. A curable material 510 includes a plurality of magnetic particles 524 that have been oriented with their magnetization directions parallel to the prongs 518, 520. The curable material 510 is then cured onto the flexible extension region 512 to yield a cured structure 517 (FIG. 3B). A mirror 540 is attached to surface 525 of the cured material 517.

Figure 3C:
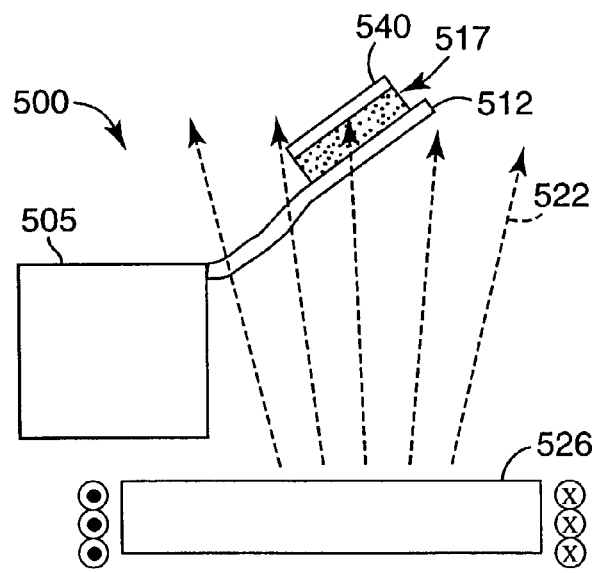
FIG. 3C shows a side view of the magnetic actuator of FIG. 3B under the influence of a magnetic field.

Referring to FIGS. 3B and 3C, an electromagnet 526 is situated below the part 500. Upon activation of the electromagnet 526, the magnetic particles 524 within the cured material 517 respond to the magnetic field 522 generated by the electromagnet 526 to move the flexible extension region 512. The mirror 540 can be used to guide light in a variety of directions depending on the orientation of the flexible extension region 512.

Reactive Species

The multi-photon reactive compositions that can be used to form the above-described structures include curable or non-curable reactive species, a multi-photon photoinitiator system, and a plurality of substantially inorganic colloidal particles. The multi-photon photoinitiator system includes a multi-photon photosensitizer, an electron acceptor, and an optional electron donor.

Compositions of the invention can optionally include further non-reactive species.

Curable species include addition-polymerizable monomers and oligomers and addition-crosslinkable polymers (such as free-radically polymerizable or crosslinkable ethylenically-unsaturated species including, for example, acrylates, methacrylates, and certain vinyl compounds such as styrenes), as well as cationically-polymerizable monomers and oligomers and cationically-crosslinkable polymers (including, for example, epoxies, vinyl ethers, and cyanate esters), and the like, and mixtures thereof.

Suitable ethylenically-unsaturated species are described, for example, in U.S. Pat. No. 5,545,676, and include mono-, di-, and poly-acrylates and methacrylates (for example, methyl acrylate, methyl methacrylate, ethyl acrylate, isopropyl methacrylate, n-hexyl acrylate, stearyl acrylate, allyl acrylate, glycerol diacrylate, glycerol triacrylate, ethyleneglycol diacrylate, diethyleneglycol diacrylate, triethyleneglycol dimethacrylate, 1,3-propanediol diacrylate, 1,3-propanediol dimethacrylate, trimethylolpropane triacrylate, 1,2, 4-butanetriol trimethacrylate, 1,4-cyclohexanediol diacrylate, pentaerythritol triacrylate, pentaerythritol tetraacrylate, pentaerythritol tetramethacrylate, sorbitol hexacrylate, bis[1-(2-acryloxy)]-p-ethoxyphenyldimethylmethane, bis[1-(3-acryloxy-2-hydroxy)]-p-propoxyphenyldimethylmethane, tris-hydroxyethyl-isocyanurate trimethacrylate, the bis-acrylates and bis-methacrylates of polyethylene glycols of molecular weight about 200-500, copolymerizable mixtures of acrylated monomers such as those described in U.S. Pat. No. 4,652,274, and acrylated oligomers such as those described in U.S. Pat. No. 4,642, 126); unsaturated amides (for example, methylene bis-acrylamide, methylene bis-methacrylamide, 1,6-hexamethylene bis-acrylamide, diethylene triamine tris-acrylamide and beta-methacrylaminoethyl methacrylate); vinyl compounds (for example, styrene, diallyl phthalate, divinyl succinate, divinyl adipate, and divinyl phthalate); and the like; and mixtures thereof.

Suitable curable polymers include polymers with pendant (meth)acrylate groups, for example, having from 1 to about 50 (meth)acrylate groups per polymer chain. Examples of such polymers include aromatic acid (meth)acrylate half ester resins such as those available under the trade designation SARBOX from Sartomer (for example, SARBOX 400, 401, 402, 404, and 405). Other useful polymers curable by free radical chemistry include those polymers that have a hydrocarbyl backbone and pendant peptide groups with free-radically polymerizable functionality attached thereto, such as those described in U.S. Pat. No. 5,235,015. Mixtures of two or more monomers, oligomers, and/or reactive polymers can be used if desired. Preferred ethylenically-unsaturated species include acrylates, aromatic acid (meth)acrylate half ester resins, and polymers that have a hydrocarbyl backbone and pendant peptide groups with free-radically polymerizable functionality attached thereto.

Suitable cationically-curable species are described, for example, in U.S. Pat. Nos. 5,998,495 and 6,025,406 and include epoxy resins. Such materials, broadly called epoxides, include monomeric epoxy compounds and epoxides of the polymeric type and can be aliphatic, alicyclic, aromatic, or heterocyclic. These materials generally have, on the average, at least 1 polymerizable epoxy group per molecule (preferably, at least about 1.5 and, more preferably, at least about 2). The polymeric epoxides include linear polymers having terminal epoxy groups (for example, a diglycidyl ether of a polyoxyalkylene glycol), polymers having skeletal oxirane units (for example, polybutadiene polyepoxide), and polymers having pendant epoxy groups (for example, a glycidyl methacrylate polymer or copolymer). The epoxides can be pure compounds or can be mixtures of compounds containing one, two, or more epoxy groups per molecule. These epoxy-containing materials can vary greatly in the nature of their backbone and substituent groups. For example, the backbone can be of any type and substituent groups thereon can be any group that does not substantially interfere with cationic cure at room temperature. Illustrative of permissible substituent groups include halogens, ester groups, ethers, sulfonate groups, siloxane groups, nitro groups, phosphate groups, and the like. The molecular weight of the epoxy-containing materials can vary from about 58 to about 100,000 or more.

Useful epoxy-containing materials include those which contain cyclohexene oxide groups such as epoxycyclohexanecarboxylates, typified by 3,4-epoxycyclohexylmethyl-3,4-epoxycyclohexanecarboxylate, 3,4-epoxy-2-methylcyclohexylmethyl-3,4-epoxy-2-methylcyclohexane carboxylate, and bis(3,4-epoxy-6-methylcyclohexylmethyl) adipate. A more detailed list of useful epoxides of this nature is set forth in U.S. Pat. No. 3,117,099.

Other epoxy-containing materials that are useful include glycidyl ether monomers of the formula

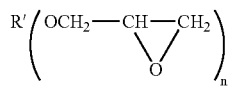

where R' is alkyl or aryl and n is an integer of 1 to 6. Examples are glycidyl ethers of polyhydric phenols obtained by reacting a polyhydric phenol with an excess of a chlorohydrin such as epichlorohydrin (for example, the diglycidyl ether of 2,2-bis-(2,3-epoxypropoxyphenol)-propane). Additional examples of epoxides of this type are described in U.S. Pat. No. 3,018,262, and in *Handbook of Epoxy Resins*, Lee and Neville, McGraw-Hill Book Co., New York (1967).

Numerous commercially available epoxy resins can also be utilized. In particular, epoxides that are readily available include octadecylene oxide, epichlorohydrin, styrene oxide, vinyl cyclohexene oxide, glycidol, glycidylmethacrylate, diglycidyl ethers of Bisphenol A (for example, those available under the trade designations EPON 828, EPON 825, EPON 1004, and EPON 1010 from Resolution Performance Products, formerly Shell Chemical Co., as well as those available under the trade designations DER 331, DER 332, and DER 334 from Dow Chemical Co.), vinylcyclohexene dioxide (for example, the compounds available under the trade designations ERL 4206 from Union Carbide Corp.), 3,4-epoxycyclohexylmethyl-3,4-epoxycyclohexene carboxylate (for example, the compounds available under the trade designations ERL 4221, Cyracure UVR 6110 or UVR 6105 from Union Carbide Corp.), 3,4-epoxy-6-methylcyclohexylmethyl-3,4-epoxy-6-methyl-cyclohexene carboxylate (for example, the compounds available under the trade designation ERL 4201 from Union Carbide Corp.), bis(3,4-epoxy-6-methylcyclohexylmethyl) adipate (for example, the compounds available under the trade designation ERL 4289 from Union Carbide Corp.), bis(2,3-epoxycyclopentyl) ether (for example, the compounds available under the trade designation ERL 0400 from Union Carbide Corp.), aliphatic epoxy modified from polypropylene glycol (for example, those available under the trade designations ERL 4050 and ERL 4052 from Union Carbide Corp.), dipentene dioxide (for example, the compounds available under the trade designation ERL 4269 from Union Carbide Corp.), epoxidized polybutadiene (for example, the compounds available under the trade designations Oxiron 2001 from FMC Corp.), silicone resin containing epoxy functionality, flame retardant epoxy resins (for example, those available under the trade designation DER 580, a brominated bisphenol type epoxy resin available from Dow Chemical Co.), 1,4-butanediol diglycidyl ether of phenolformaldehyde novolak (for example, those available under the trade designations DEN 431 and DEN 438 from Dow Chemical Co.), resorcinol diglycidyl ether (for example, the compounds available under the trade designation KOPOXITE from Koppers Company, Inc.), bis(3,4-epoxycyclohexyl)adipate (for example, those available under the trade designations ERL 4299 or UVR 6128, from Union Carbide Corp.), 2-(3,4-epoxycyclohexyl-5,5-spiro-3,4-epoxy) cyclohexane-meta-dioxane (for example, the compounds available under the trade designation ERL-4234 from Union Carbide Corp.), vinylcyclohexene monoxide 1,2-epoxyhexadecane (for example, the compounds available under the trade designation UVR-6216 from Union Carbide Corp.), alkyl glycidyl ethers such as alkyl $C_8$-$C_{10}$ glycidyl ether (for example, those available under the trade designation HELOXY MODIFIER 7 from Resolution Performance Products), alkyl $C_{12}$-$C_{14}$ glycidyl ether (for example, those available under the trade designation HELOXY MODIFIER 8 from Resolution Performance Products), butyl glycidyl ether (for example, those available under the trade designation HELOXY MODIFIER 61 from Resolution Performance Products), cresyl glycidyl ether (for example, HELOXY MODIFIER 62 from Resolution Performance Products), p-tert-butylphenyl glycidyl ether (for example, Heloxy Modifier 65 from Resolution Performance Products), polyfunctional glycidyl ethers such as diglycidyl ether of 1,4-butanediol (for example, HELOXY MODIFIER 67 from Resolution Performance Products), diglycidyl ether of neopentyl glycol (for example, HELOXY MODIFIER 68 from Resolution Performance Products), diglycidyl ether of cyclohexanedimethanol (for example, HELOXY MODIFIER 107 from Resolution Performance Products), trimethylol ethane triglycidyl ether (for example, HELOXY MODIFIER 44 from Resolution Performance Products), trimethylol propane triglycidyl ether (for example, HELOXY MODIFIER 48 from Resolution Performance Products), polyglycidyl ether of an aliphatic polyol (for example, HELOXY MODIFIER 84 from Resolution Performance Products), polyglycol diepoxide (for example, HELOXY MODIFIER 32 from Resolution Performance Products), bisphenol F epoxides (for example, those available under the trade designations EPON 1138 from Resolution Performance Products or GY-281 from Ciba-Geigy Corp.), and 9,9-bis[4-(2,3-epoxypropoxy)-phenyl]fluorenone (for example, those available under the trade designation EPON 1079 from Resolution Performance Products).

Other useful epoxy resins comprise copolymers of acrylic acid esters of glycidol (such as glycidylacrylate and glycidylmethacrylate) with one or more copolymerizable vinyl compounds. Examples of such copolymers are 1:1 styrene-glycidylmethacrylate, 1:1 methylmethacrylate-glycidylacrylate, and a 62.5:24:13.5 methylmethacrylate-ethyl acrylate-glycidylmethacrylate. Other useful epoxy resins are well known and contain such epoxides as epichlorohydrins, alkylene oxides (for example, propylene oxide), styrene oxide, alkenyl oxides (for example, butadiene oxide), and glycidyl esters (for example, ethyl glycidate).

Useful epoxy-functional polymers include epoxy-functional silicones such as those described in U.S. Pat. No. 4,279,717, which are commercially available from the General Electric Company. These are polydimethylsiloxanes in which 1-20 mole % of the silicon atoms have been substituted with epoxyalkyl groups (preferably, epoxy cyclohexylethyl, as described in U.S. Pat. No. 5,753,346.

Blends of various epoxy-containing materials can also be utilized. Such blends can comprise two or more weight average molecular weight distributions of epoxy-containing compounds (such as low molecular weight (below 200), intermediate molecular weight (about 200 to 10,000), and higher molecular weight (above about 10,000)). Alternatively or additionally, the epoxy resin can contain a blend of epoxy-containing materials having different chemical natures (such as aliphatic and aromatic) or functionalities (such as polar and non-polar). Other cationically-reactive polymers (such as vinyl ethers and the like) can additionally be incorporated, if desired.

Preferred epoxies include aromatic glycidyl epoxies (such as the EPON resins available from Resolution Performance Products) and cycloaliphatic epoxies (such as ERL 4221 and ERL 4299 available from Union Carbide).

Suitable cationically-curable species also include vinyl ether monomers, oligomers, and reactive polymers (for example, methyl vinyl ether, ethyl vinyl ether, tert-butyl vinyl ether, isobutyl vinyl ether, triethyleneglycol divinyl ether (for example, those available under the trade designation RAPI-CURE DVE-3 from International Specialty Products, Wayne, N.J.), trimethylolpropane trivinyl ether (for example, those available under the trade designation TMPTVE from BASF Corp., Mount Olive, N.J.), and those available under the trade designation VECTOMER divinyl ether resins from Allied Signal (for example, VECTOMER 2010, VECTOMER 2020, VECTOMER 4010, and VECTOMER 4020 and their equivalents available from other manufacturers), and mixtures thereof. Blends (in any proportion) of one or more vinyl ether resins and/or one or more epoxy resins can also be utilized. Polyhydroxy-functional materials (such as those described, for example, in U.S. Pat. No. 5,856,373 (Kaisaki et al.)) can also be utilized in combination with epoxy- and/or vinyl ether-functional materials.

Non-curable reactive species include, for example, reactive polymers whose solubility can be increased upon acid- or radical-induced reaction. Such reactive polymers include, for example, aqueous insoluble polymers bearing ester groups that can be converted by photogenerated acid to aqueous soluble acid groups (for example, poly(4-tert-butoxycarbonyloxystyrene). Non-curable reactive species also include the chemically-amplified photoresists described by R. D. Allen, G. M. Wallraff, W. D. Hinsberg, and L. L. Simpson in "High Performance Acrylic Polymers for Chemically Amplified Photoresist Applications," J. Vac. Sci. Technol. B, 9, 3357 (1991). The chemically-amplified photoresist concept is now widely used for microchip manufacturing, especially with sub-0.5 micron (or even sub-0.2 micron) features. In such photoresist systems, catalytic species (typically hydrogen ions) can be generated by irradiation, which induces a cascade of chemical reactions. This cascade occurs when hydrogen ions initiate reactions that generate more hydrogen ions or other acidic species, thereby amplifying reaction rate. Examples of typical acid-catalyzed chemically-amplified photoresist systems include deprotection (for example, t-butoxycarbonyloxystyrene resists as described in U.S. Pat. No. 4,491,628, tetrahydropyran (THP) methacrylate-based materials, THP-phenolic materials such as those described in U.S. Pat. No. 3,779,778, t-butyl methacrylate-based materials such as those described by R. D Allen et al. in Proc. SPIE 2438, 474 (1995), and the like); depolymerization (for example, polyphthalaldehyde-based materials); and rearrangement (for example, materials based on the pinacol rearrangements).

Multi-photon Photoinitiator System (1) Multi-photon Photosensitizers

Multi-photon photosensitizers suitable for use in the multi-photon reactive composition are capable of simultaneously absorbing at least two photons when exposed to radiation from an appropriate light source in the exposure system. Preferred multi-photon photosensitizers have a two-photon absorption cross-section greater than that of fluorescein (that is, greater than that of 3',6'- dihydroxyspiro [isobenzofuran-1(3H), 9'-[9H]xanthen]3-one) when measured at the same wavelength. Generally, the two photon absorption cross-section can be greater than about $50 \times 10^{-50}$ $cm^4$ sec/photon, as measured by the method described by C. Xu and W. W. Webb in J. Opt. Soc. Am. B, 13, 481 (1996) and WO 98/21521.

This method involves the comparison (under identical excitation intensity and photosensitizer concentration conditions) of the two-photon fluorescence intensity of the photosensitizer with that of a reference compound. The reference compound can be selected to match as closely as possible the spectral range covered by the photosensitizer absorption and fluorescence. In one possible experimental set-up, an excitation beam can be split into two arms, with 50% of the excitation intensity going to the photosensitizer and 50% to the reference compound. The relative fluorescence intensity of the photosensitizer with respect to the reference compound can then be measured using two photomultiplier tubes or other calibrated detector. Finally, the fluorescence quantum efficiency of both compounds can be measured under one-photon excitation.

Methods of determining fluorescence and phosphorescence quantum yields are well-known in the art. Typically, the area under the fluorescence (or phosphorescence) spectrum of a compound of interest is compared with the area under the fluorescence (or phosphorescence) spectrum of a standard luminescent compound having a known fluorescence (or phosphorescence) quantum yield, and appropriate corrections are made (which take into account, for example, the optical density of the composition at the excitation wavelength, the geometry of the fluorescence detection apparatus, the differences in the emission wavelengths, and the response of the detector to different wavelengths). Standard methods are described, for example, by I. B. Berlman in *Handbook of Fluorescence Spectra of Aromatic Molecules*, Second Edition, pages 24-27, Academic Press, New York (1971); by J. N. Demas and G. A. Crosby in J. Phys. Chem. 75, 991-1024 (1971); and by J. V. Morris, M. A. Mahoney, and J. R. Huber in J. Phys. Chem. 80, 969-974 (1976).

Assuming that the emitting state is the same under one- and two-photon excitation (a common assumption), the two-photon absorption cross-section of the photosensitizer, ($d_{sam}$), is equal to $d_{ref}$ K ($I_{sam}/I_{ref}$)($F_{sam}/F_{ref}$), wherein $d_{ref}$ is the two-photon absorption cross-section of the reference compound, $I_{sam}$ is the fluorescence intensity of the photosensitizer, $I_{ref}$ is the fluorescence intensity of the reference compound, $F_{sam}$ is the fluorescence quantum efficiency of the photosensitizer, $F_{ref}$ is the fluorescence quantum efficiency of the reference compound, and K is a correction factor to account for slight differences in the optical path and response of the two detectors. K can be determined by measuring the response with the same photosensitizer in both the sample and reference arms. To ensure a valid measurement, the clear quadratic dependence of the two-photon fluorescence intensity on excitation power can be confirmed, and relatively low concentrations of both the photosensitizer and the reference compound can be utilized (to avoid fluorescence reabsorption and photosensitizer aggregation effects).

When the photosensitizer is not fluorescent, the yield of electronic excited states can be measured and compared with a known standard. In addition to the above-described method of determining fluorescence yield, various methods of measuring excited state yield are known (including, for example, transient absorbance, phosphorescence yield, photoproduct formation or disappearance of photosensitizer (from photoreaction), and the like).

Preferably, the two-photon absorption cross-section of the photosensitizer is greater than about 1.5 times that of fluorescein (or, alternatively, greater than about $75 \times 10^{-50}$ cm$^4$ sec/photon, as measured by the above method); more preferably, greater than about twice that of fluorescein (or, alternatively, greater than about $100 \times 10^{-50}$ cm$^4$ sec/photon); most preferably, greater than about three times that of fluorescein (or, alternatively, greater than about $150 \times 10^{-50}$ cm$^4$ sec/photon); and optimally, greater than about four times that of fluorescein (or, alternatively, greater than about $200 \times 10^{-50}$ cm$^4$ sec/photon).

Preferably, the photosensitizer is soluble in the reactive species (if the reactive species is liquid) or is compatible with the reactive species and with any binders (as described below) that are included in the multi-photon reactive composition. Most preferably, the photosensitizer is also capable of sensitizing 2-methyl-4,6-bis(trichloromethyl)-s-triazine under continuous irradiation in a wavelength range that overlaps the single photon absorption spectrum of the photosensitizer (single photon absorption conditions), using the test procedure described in U.S. Pat. No. 3,729,313. Using currently available materials, that test can be carried out as follows:

A standard test solution can be prepared having the following composition: 5.0 parts of a 5% (weight by volume) solution in methanol of 45,000-55,000 molecular weight, 9.0-13.0% hydroxyl content polyvinyl butyral (for example, those available under the trade designation BUTVAR B76 from Monsanto); 0.3 parts trimethylolpropane trimethacrylate; and 0.03 parts 2-methyl-4,6-bis(trichloromethyl)-s-triazine (see Bull. Chem. Soc. Japan, 42, 2924-2930 (1969)). To this solution can be added 0.01 parts of the compound to be tested as a photosensitizer. The resulting solution can then be knife-coated onto a 0.05 mm clear polyester film using a knife orifice of 0.05 mm, and the coating can be air dried for about 30 minutes. A 0.05 mm clear polyester cover film can be carefully placed over the dried but soft and tacky coating with minimum entrapment of air. The resulting sandwich construction can then be exposed for three minutes to 161,000 Lux of incident light from a tungsten light source providing light in both the visible and ultraviolet range (such as that produced from a FCH 650 W quartz-iodine lamp, available from General Electric). Exposure can be made through a stencil to provide exposed and unexposed areas in the construction. After exposure the cover film can be removed, and the coating can be treated with a finely divided colored powder, such as a color toner powder of the type conventionally used in xerography. If the tested compound is a photosensitizer, the trimethylolpropane trimethacrylate monomer will be polymerized in the light-exposed areas by the light-generated free radicals from the 2-methyl-4,6-bis(trichloromethyl)-s-triazine. Since the polymerized areas will be essentially tack-free, the colored powder will selectively adhere essentially only to the tacky, unexposed areas of the coating, providing a visual image corresponding to that in the stencil.

Preferably, a photosensitizer can also be selected based in part upon shelf stability considerations. Accordingly, selection of a particular photosensitizer can depend to some extent upon the particular reactive species utilized (as well as upon the choices of electron donor compound and/or electron acceptor).

Particularly preferred multi-photon photosensitizers include those exhibiting large multi-photon absorption cross-sections, such as Rhodamine B (that is, N-[9-(2-carboxyphenyl)-6-(diethylamino)-3H-xanthen-3-ylidene]-N-ethylethanaminium chloride and the hexafluoroantimonate salt of Rhodamine B) and the four classes of photosensitizers described, for example, by Marder and Perry et al. WO 98/21521 and WO 99/53242. The four classes can be described as follows: (a) molecules in which two donors are connected to a conjugated π-electron bridge; (b) molecules in which two donors are connected to a conjugated π-electron bridge which is substituted with one or more electron accepting groups; (c) molecules in which two acceptors are connected to a conjugated π-electron bridge; and (d) molecules in which two acceptors are connected to a conjugated π-electron bridge which is substituted with one or more electron donating groups (where "bridge" means a molecular fragment that connects two or more chemical groups, "donor" means an atom or group of atoms with a low ionization potential that can be bonded to a conjugated π-electron bridge, and "acceptor" means an atom or group of atoms with a high electron affinity that can be bonded to a conjugated π-electron bridge).

Representative examples of such photosensitizers include the following:

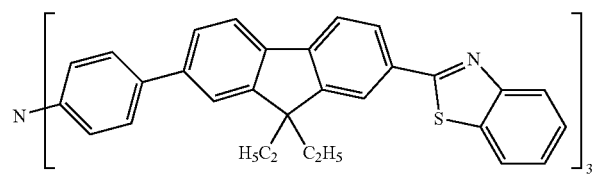

-continued
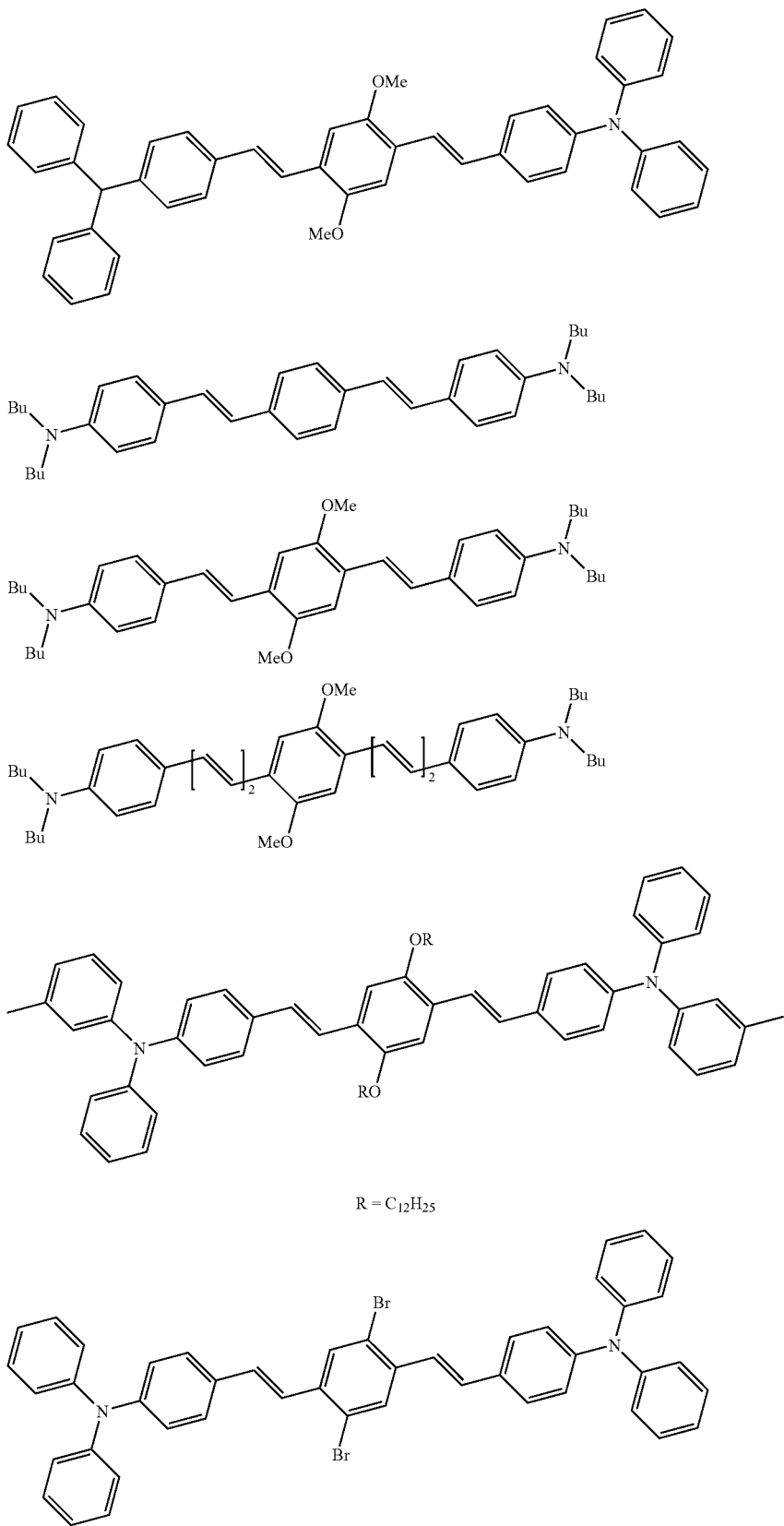
R = C₁₂H₂₅

-continued
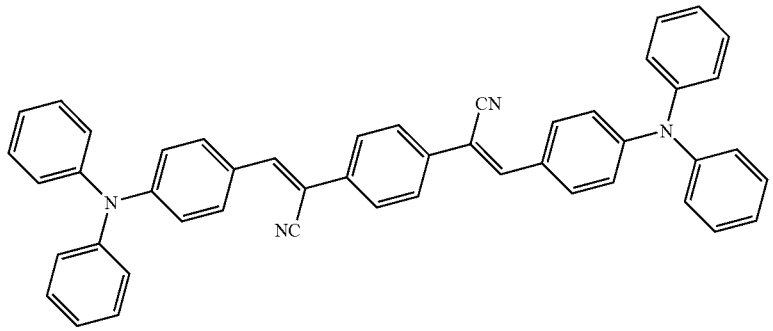
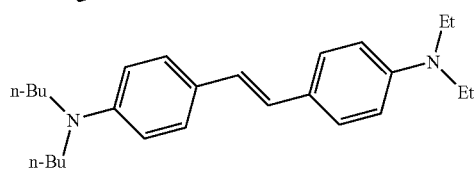
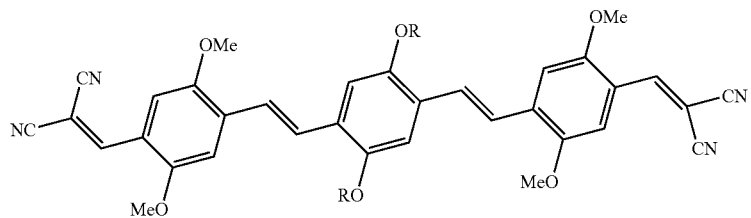
R = C₁₂H₂₅
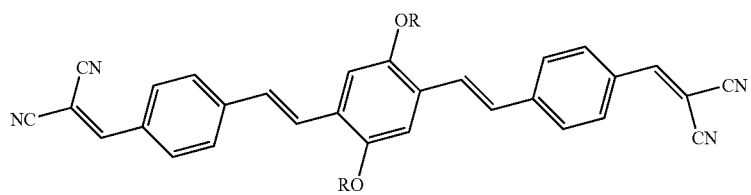
R = C₁₂H₂₅
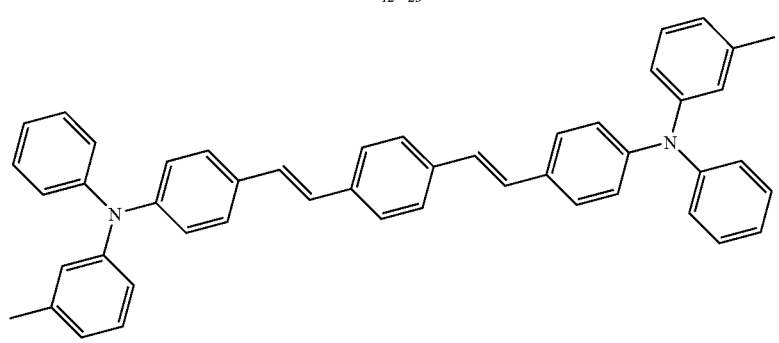
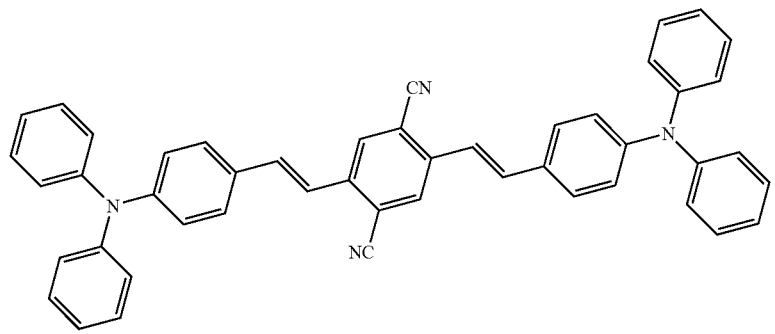

-continued
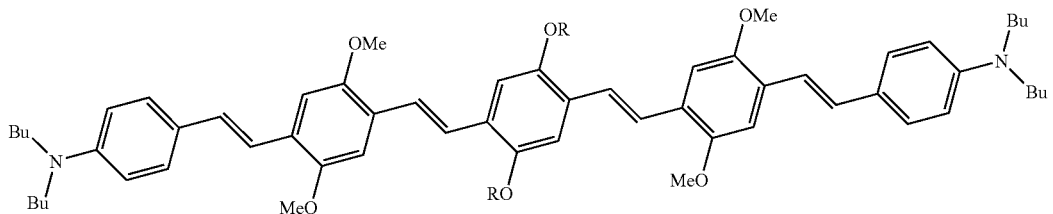
R = C$_{12}$H$_{25}$
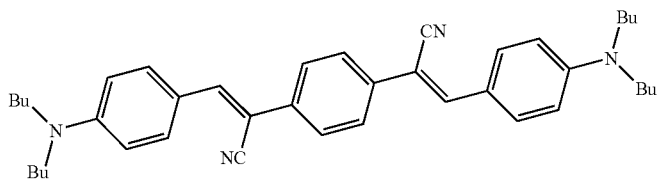
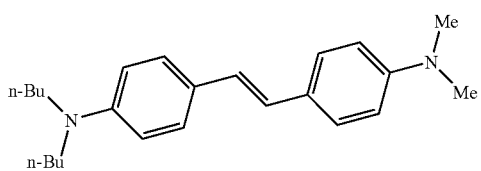
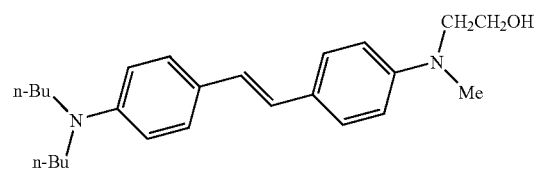
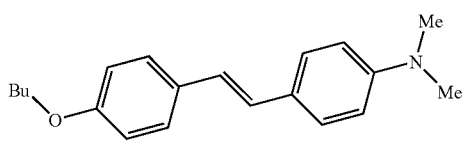
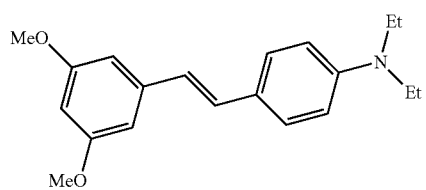
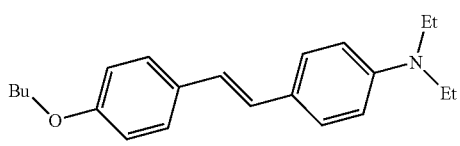
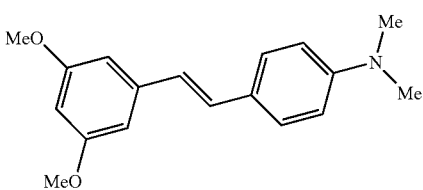
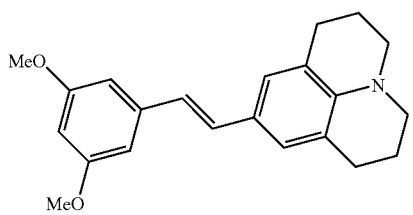
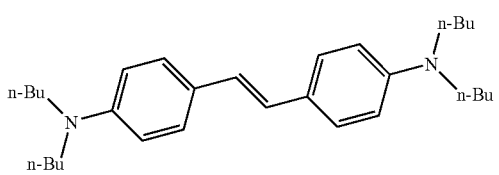
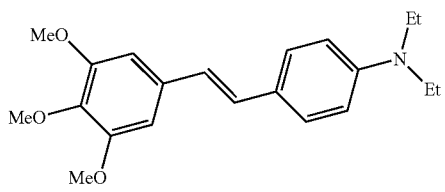
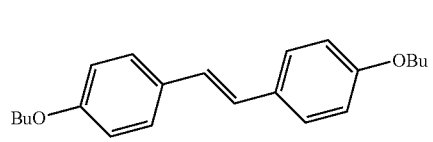
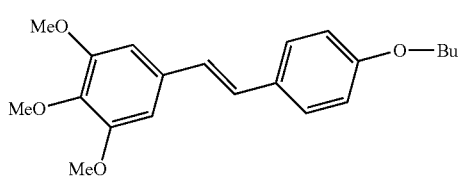
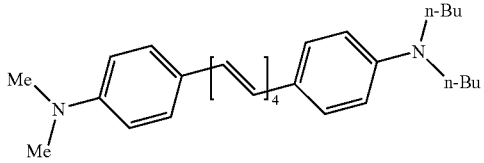

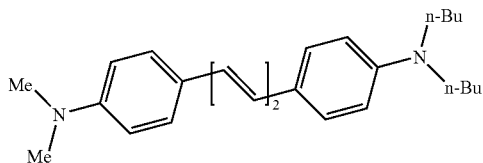
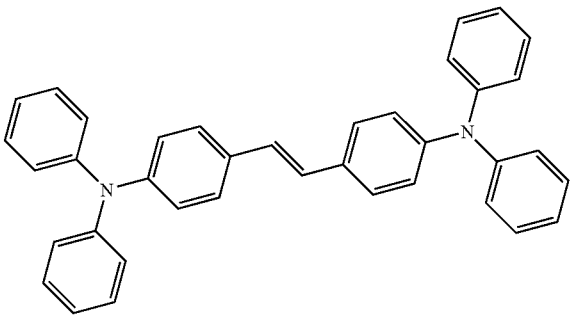

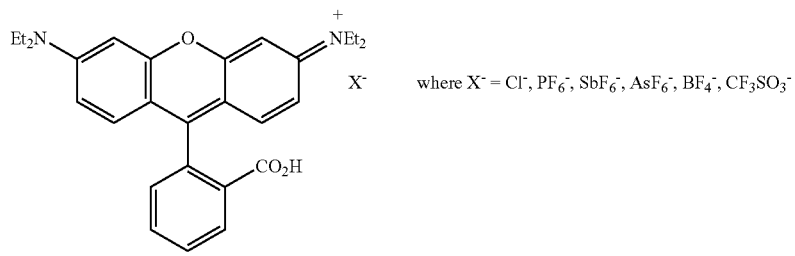

where X⁻ = Cl⁻, $PF_6^-$, $SbF_6^-$, $AsF_6^-$, $BF_4^-$, $CF_3SO_3^-$

The four classes of photosensitizers described above can be prepared by reacting aldehydes with ylides under standard Wittig conditions or by using the McMurray reaction, as detailed in WO 98/21521.

Other suitable compounds are described in U.S. Pat. Nos. 6,100,405, 5,859,251, and 5,770,737 as having large multi-photon absorption cross-sections, although these cross-sections were determined by a method other than that described above. Representative examples of such compounds include the following:

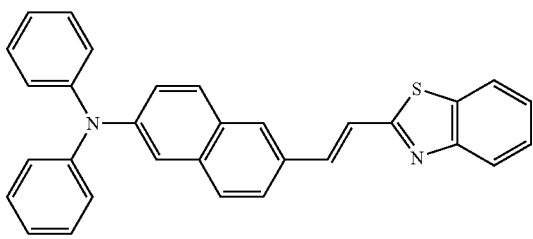
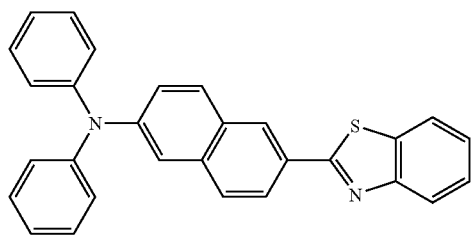

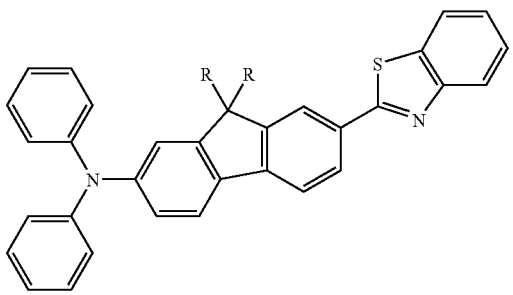

R = R = C2H5, C10H21, C18H37

-continued
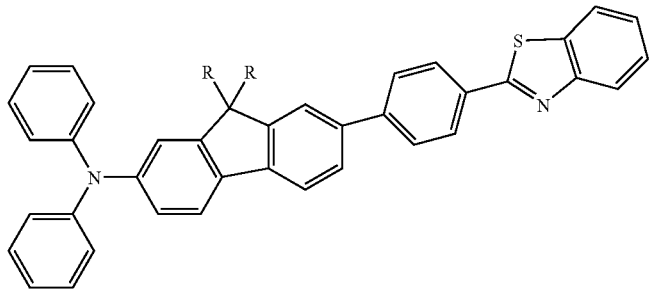
R = C₂H₅
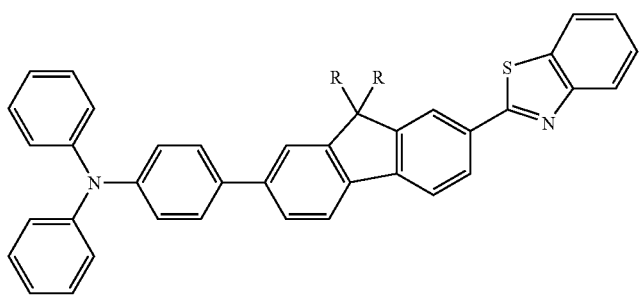
R = C₂H₅
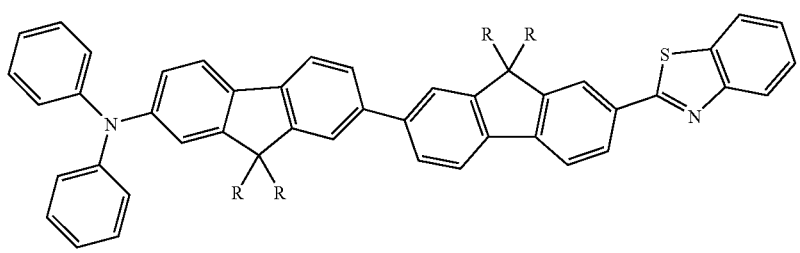
R = C₂H₅
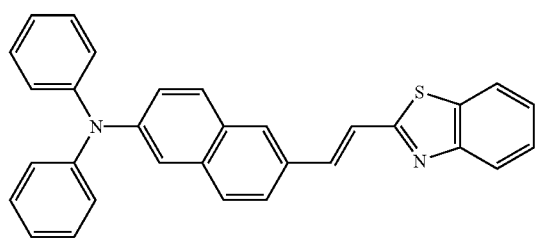
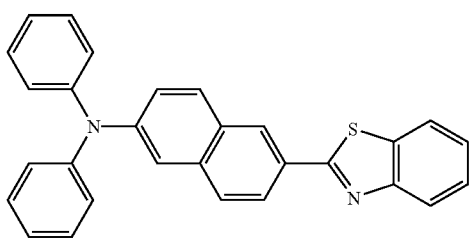
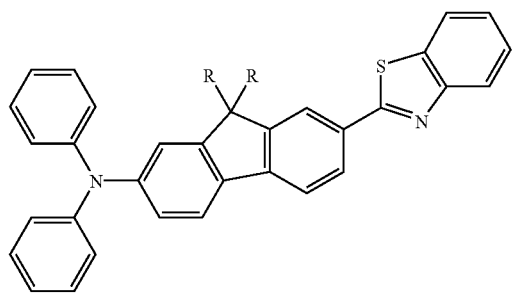
R = R = C2H5, C10H21, C18H37

-continued
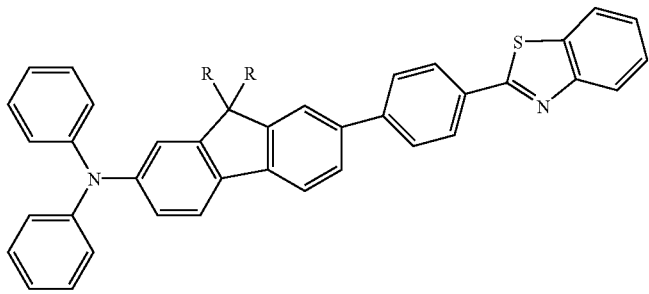
R = C₂H₅
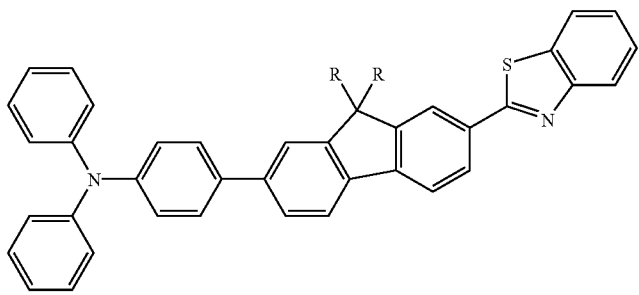
R = C₂H₅
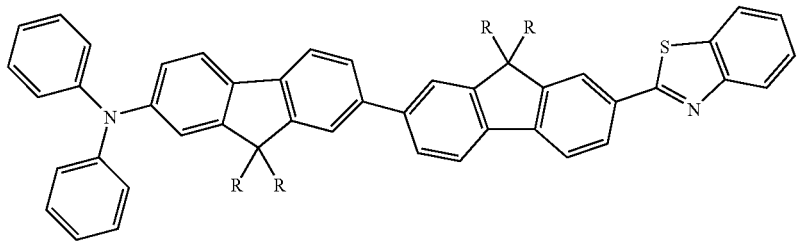
R = C₂H₅
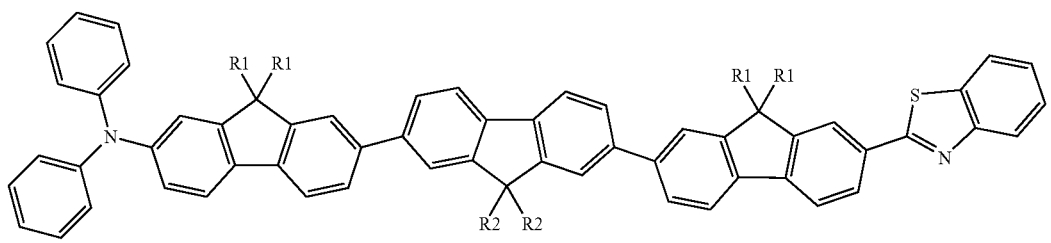
R1 = C₂H₅
R2 = C₁₀H₂₁
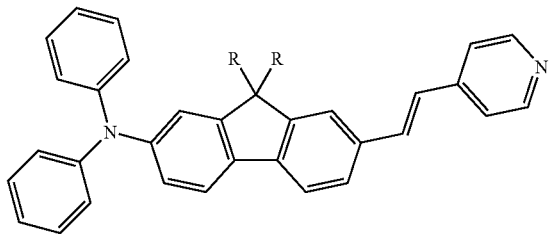
R = C₁₀H₂₁

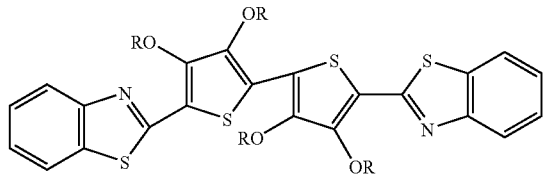

R = C$_{10}$H$_{21}$ (2) Electron Acceptor Compounds

Suitable electron acceptors for the multi-photon reactive compositions are capable of being photosensitized by accepting an electron from an electronic excited state of the multi-photon photosensitizer, resulting in the formation of at least one free radical and/or acid. Such electron acceptors include iodonium salts (for example, diaryliodonium salts), chloromethylated triazines (for example, 2-methyl-4,6-bis (trichloromethyl)-s-triazine, 2,4,6-tris(trichloromethyl)-s-triazine, and 2-aryl-4,6-bis(trichloromethyl)-s-triazine), diazonium salts (for example, phenyldiazonium salts optionally substituted with groups such as alkyl, alkoxy, halo, or nitro), sulfonium salts (for example, triarylsulfonium salts optionally substituted with alkyl or alkoxy groups, and optionally having 2,2' oxy groups bridging adjacent aryl moieties), azinium salts (for example, an N-alkoxypyridinium salt), and triarylimidazolyl dimers (preferably, 2,4,5-triphenylimidazolyl dimers such as 2,2',4,4',5,5'-tetraphenyl-1,1'-biimidazole, optionally substituted with groups such as alkyl, alkoxy, or halo), and the like, and mixtures thereof.

The electron acceptor is preferably soluble in the reactive species and is preferably shelf-stable (that is, does not spontaneously promote reaction of the reactive species when dissolved therein in the presence of the photosensitizer and an electron donor compound). Accordingly, selection of a particular electron acceptor can depend to some extent upon the particular reactive species, photosensitizer, and electron donor compound chosen, as described above.

Suitable iodonium salts include those described in U.S. Pat. Nos. 5,545,676, 3,729,313, 3,741,769, 3,808,006, 4,250,053 and 4,394,403. The iodonium salt can be a simple salt (for example, containing an anion such as Cl—, Br—, I— or C$_4$H$_5$SO$_3$—) or a metal complex salt (for example, containing SbF$_6$—, PF$_6$—, BF$_4$—, tetrakis(perfluorophenyl) borate, SbF$_5$ OH— or AsF$_6$—). Mixtures of Iodonium salts can be used if desired.

Examples of useful aromatic iodonium complex salt electron acceptors include diphenyliodonium tetrafluoroborate; di(4-methylphenyl)iodonium tetrafluoroborate; phenyl-4-methylphenyliodonium tetrafluoroborate; di(4-heptylphenyl)iodonium tetrafluoroborate; di(3-nitrophenyl)iodonium hexafluorophosphate; di(4-chlorophenyl)iodonium hexafluorophosphate; di(naphthyl)iodonium tetrafluoroborate; di(4-trifluoromethylphenyl)iodonium tetrafluoroborate; diphenyliodonium hexafluorophosphate; di(4-methylphenyl)iodonium hexafluorophosphate; diphenyliodonium hexafluoroarsenate; di(4-phenoxyphenyl)iodonium tetrafluoroborate; phenyl-2-thienyliodonium hexafluorophosphate; 3,5-dimethylpyrazolyl-4-phenyliodonium hexafluorophosphate; diphenyliodonium hexafluoroantimonate; 2,2'-diphenyliodonium tetrafluoroborate; di(2,4-dichlorophenyl) iodonium hexafluorophosphate; di(4-bromophenyl) iodonium hexafluorophosphate; di(4-methoxyphenyl) iodonium hexafluorophosphate; di(3-carboxyphenyl) iodonium hexafluorophosphate; di(3-methoxycarbonylphenyl)iodonium hexafluorophosphate; di(3-methoxysulfonylphenyl)iodonium hexafluorophosphate; di(4-acetamidophenyl)iodonium hexafluorophosphate; di(2-benzothienyl)iodonium hexafluorophosphate; and diphenyliodonium hexafluoroantimonate; and the like; and mixtures thereof. Aromatic iodonium complex salts can be prepared by metathesis of corresponding aromatic iodonium simple salts (such as, for example, diphenyliodonium bisulfate) in accordance with the teachings of Beringer et al., J. Am. Chem. Soc. 81, 342 (1959).

Preferred iodonium salts include diphenyliodonium salts (such as diphenyliodonium chloride, diphenyliodonium hexafluorophosphate, and diphenyliodonium tetrafluoroborate), diaryliodonium hexafluoroantimonate (for example, those available under the trade designation SARCAT SR 1012 from Sartomer Company), and mixtures thereof.

Suitable anions, X—, for the sulfonium salts (and for any of the other types of electron acceptors) include a variety of anion types such as, for example, imide, methide, boron-centered, phosphorous-centered, antimony-centered, arsenic-centered, and aluminum-centered anions.

Illustrative, but not limiting, examples of suitable imide and methide anions include $(C_2F_5SO_2)_2N^-$, $(C_4F_9SO_2)_2N^-$, $(C_8F_{17}SO_2)_3C^-$, $(CF_3SO_2)_3C^-$, $(CF_3SO_2)_2N^-$, $(C_4F_9SO_2)_3C^-$, $(CF_3SO_2)_2(C_4F_9SO_2)C^-$, $(CF_3SO_2)(C_4F_9SO_2)N^-$, $((CF_3)_2NC_2F_4SO_2)_2N^-$, $(CF_3)_2NC_2F_4SO_2C^-(SO_2CF_3)_2$, $(3,5$-bis$(CF_3)C_6H_3)SO_2N^-SO_2CF_3$, $C_6H_5SO_2C^-(SO_2CF_3)_2$, $C_6H_5SO_2N^-SO_2CF_3$, and the like. Preferred anions of this type include those represented by the formula $(R_fSO_2)_3C^-$, wherein $R_f$ is a perfluoroalkyl radical having from 1 to about 4 carbon atoms.

Illustrative, but not limiting, examples of suitable boron-centered anions include $F_4B^-$, $(3,5$-bis$(CF_3)C_6H_3)_4B^-$, $(C_6F_5)_4B^-$, $(p$-$CF_3C_6H_4)_4B^-$, $(m$-$CF_3C_6H_4)_4B^-$, $(p$-$FC_6H_4)_4B^-$, $(C_6F_5)_3(CH_3)B^-$, $(C_6F_5)_3(n$-$C_4H_9)B^-$, $(p$-$CH_3C_6H_4)_3(C_6F_5)B^-$, $(C_6F_5)_3FB^-$, $(C_6H_5)_3(C_6F_5)B^-$, $(CH_3)_2(p$-$CF_3C_6H_4)_2B^-$, $(C_6F_5)_3(n$-$C_{18}H_{37}O)B^-$, and the like. Preferred boron-centered anions generally contain 3 or more halogen-substituted aromatic hydrocarbon radicals attached to boron, with fluorine being the most preferred halogen. Illustrative, but not limiting, examples of the preferred anions include $(3,5$-bis$(CF_3)C_6H_3)_4B^-$, $(C_6F_5)_4B^-$, $(C_6F_5)_3(n$-$C_4H_9)B^-$, $(C_6F_5)_3FB^-$, and $(C_6F_5)_3(CH_3)B^-$.

Suitable anions containing other metal or metalloid centers include, for example, $(3,5$-bis$(CF_3)C_6H_3)_4Al^-$, $(C_6F_5)_4Al^-$, $(C_6F_5)_2F_4P^-$, $(C_6F_5)F_5P^-$, $F_6P^-$, $(C_6F_5)F_5Sb^-$, $F_6Sb^-$, $(HO)F_5Sb^-$, and $F_6As^-$. Preferably, the anion, $X^-$, is selected from tetrafluoroborate, hexafluorophosphate, hexafluoroarsenate, hexafluoroantimonate, and hydroxypentafluoroantimonate (for example, for use with cationically-curable species such as epoxy resins).

Examples of suitable sulfonium salt electron acceptors include:
triphenylsulfonium tetrafluoroborate
methyldiphenylsulfonium tetrafluoroborate
dimethylphenylsulfonium hexafluorophosphate
triphenylsulfonium hexafluorophosphate
triphenylsulfonium hexafluoroantimonate
diphenylnaphthylsulfonium hexafluoroarsenate
tritolyesulfonium hexafluorophosphate
anisyldiphenylsulfonium hexafluoroantimonate
4-butoxyphenyldiphenylsulfonium tetrafluoroborate
4-chlorophenyldiphenylsulfonium hexafluorophosphate
tri(4-phenoxyphenyl)sulfonium hexafluorophosphate
di(4-ethoxyphenyl)methylsulfonium hexafluoroarsenate
4-acetonylphenyldiphenylsulfonium tetrafluoroborate
4-thiomethoxyphenyldiphenylsulfonium hexafluorophosphate
di(methoxysulfonylphenyl)methylsulfonium hexafluoroantimonate
di(nitrophenyl)phenylsulfonium hexafluoroantimonate
di(carbomethoxyphenyl)methylsulfonium hexafluorophosphate
4-acetamidophenyldiphenylsulfonium tetrafluoroborate
dimethylnaphthylsulfonium hexafluorophosphate
trifluoromethyldiphenylsulfonium tetrafluoroborate
p-(phenylthiophenyl)diphenylsulfonium hexafluoroantimonate
10-methylphenoxanthenium hexafluorophosphate
5-methylthianthrenium hexafluorophosphate
10-phenyl-9,9-dimethylthioxanthenium hexafluorophosphate
10-phenyl-9-oxothioxanthenium tetrafluoroborate
5-methyl-10-oxothianthrenium tetrafluoroborate
5-methyl-10,10-dioxothianthrenium hexafluorophosphate Preferred sulfonium salts include triaryl-substituted salts such as triarylsulfonium hexafluoroantimonate (for example, those available under the trade designation SAR-CAT SR 1010 from Sartomer Company), triarylsulfonium hexafluorophosphate (for example, those available under the trade designation SARCAT SR 1011 from Sartomer Company), and triarylsulfonium hexafluorophosphate (for example, those available under the trade designation SAR-CAT KI85 from Sartomer Company).

Useful azinium salts include those described in U.S. Pat. No. 4,859,572 which include an azinium moiety, such as a pyridinium, diazinium, or triazinium moiety. The azinium moiety can include one or more aromatic rings, typically carbocyclic aromatic rings (for example, quinolinium, isoquinolinium, benzodiazinium, and naphthodiazonium moieties), fused with an azinium ring. A quaternizing substituent of a nitrogen atom in the azinium ring can be released as a free radical upon electron transfer from the electronic excited state of the photosensitizer to the azinium electron acceptor. In one preferred form, the quaternizing substituent is an oxy substituent. The oxy substituent, —O-T, which quaternizes a ring nitrogen atom of the azinium moiety can be selected from among a variety of synthetically convenient oxy substituents. The moiety T can, for example, be an alkyl radical, such as methyl, ethyl, butyl, and so forth. The alkyl radical can be substituted. For example, aralkyl (for example, benzyl and phenethyl) and sulfoalkyl (for example, sulfomethyl) radicals can be useful. In another form, T can be an acyl radical, such as an —OC(O)-T$^1$ radical, where T$^1$ can be any of the various alkyl and aralkyl radicals described above. In addition, T$^1$ can be an aryl radical, such as phenyl or naphthyl. The aryl radical can in turn be substituted. For example, T$^1$ can be a tolyl or xylyl radical. T typically contains from 1 to about 18 carbon atoms, with alkyl moieties in each instance above preferably being lower alkyl moieties and aryl moieties in each instance preferably containing about 6 to about 10 carbon atoms. Highest activity levels have been realized when the oxy substituent, —O-T, contains 1 or 2 carbon atoms. The azinium nuclei need include no substituent other than the quaternizing substituent. However, the presence of other substituents is not detrimental to the activity of these electron acceptors.

Useful triarylimidazolyl dimers include those described in U.S. Pat. No. 4,963,47 1. These dimers include, for example, 2-(o-chlorophenyl)-4,5-bis(m-methoxyphenyl)-1,1'-biimidazole; 2,2'-bis(o-chlorophenyl)-4,4',5,5'-tetraphenyl-1,1'-biimidazole; and 2,5-bis(o-chlorophenyl)-4-[3,4-dimethoxyphenyl]-1,1'-biimidazole.

Preferred electron acceptors include photoacid generators, such as iodonium salts (more preferably, aryliodonium salts), chloromethylated triazines, sulfonium salts, and diazonium salts. More preferred are aryliodonium salts and chloromethylated triazines.

(3) Electron Donor Compounds

Electron donor compounds useful in the multi-photon photosensitizer system of the multi-photon reactive composition are compounds (other than the photosensitizer itself) that are capable of donating an electron to an electronic excited state of the photosensitizer. The electron donor compounds preferably have an oxidation potential that is greater than zero and less than or equal to that of p-dimethoxybenzene. Preferably, the oxidation potential is between about 0.3 and 1 V vs. a standard saturated calomel electrode ("S.C.E.").

The electron donor compound is also preferably soluble in the reactive species and is selected based in part upon shelf stability considerations (as described above). Suitable donors are generally capable of increasing the speed of cure or the image density of a photoreactive composition upon exposure to light of the desired wavelength.

When working with cationically-reactive species, those skilled in the art will recognize that the electron donor compound, if of significant basicity, can adversely affect the cationic reaction. (See, for example, the discussion in U.S. Pat. No. 6,025,406.)

In general, electron donor compounds suitable for use with particular photosensitizers and electron acceptors can be selected by comparing the oxidation and reduction potentials of the three components (as described, for example, in U.S. Pat. No. 4,859,572). Such potentials can be measured experimentally (for example, by the methods described by R. J. Cox, *Photographic Sensitivity*, Chapter 15, Academic Press (1973)) or can be obtained from references such as N. L. Weinburg, Ed., *Technique of Electroorganic Synthesis Part II: Techniques of Chemistry*, Vol. V (1975), and C. K. Mann and K. K. Barnes, *Electrochemical Reactions in Nonaqueous Systems* (1970). The potentials reflect relative energy relationships and can be used in the manner described below to guide electron donor compound selection.

When the photosensitizer is in an electronic excited state, an electron in the highest occupied molecular orbital (HOMO) of the photosensitizer has been lifted to a higher energy level (namely, the lowest unoccupied molecular orbital (LUMO) of the photosensitizer), and a vacancy is left behind in the molecular orbital it initially occupied. The electron acceptor can accept the electron from the higher energy orbital, and the electron donor compound can donate an electron to fill the vacancy in the originally occupied orbital, provided that certain relative energy relationships are satisfied.

If the reduction potential of the electron acceptor is less negative (or more positive) than that of the photosensitizer, an electron in the higher energy orbital of the photosensitizer is readily transferred from the photosensitizer to the lowest unoccupied molecular orbital (LUMO) of the electron acceptor, since this represents an exothermic process. Even if the process is instead slightly endothermic (that is, even if the reduction potential of the photosensitizer is up to 0.1 volt more negative than that of the electron acceptor) ambient thermal activation can readily overcome such a small barrier.

In an analogous manner, if the oxidation potential of the electron donor compound is less positive (or more negative) than that of the photosensitizer, an electron moving from the HOMO of the electron donor compound to the orbital vacancy in the photosensitizer is moving from a higher to a lower potential, which again represents an exothermic process. Even if the process is slightly endothermic (that is, even if the oxidation potential of the photosensitizer is up to 0.1 V more positive than that of the electron donor compound), ambient thermal activation can readily overcome such a small barrier.

Slightly endothermic reactions in which the reduction potential of the photosensitizer is up to 0.1 V more negative than that of the electron acceptor, or the oxidation potential of the photosensitizer is up to 0.1 V more positive than that of the electron donor compound, occur in every instance, regardless of whether the electron acceptor or the electron donor compound first reacts with the photosensitizer in its excited state. When the electron acceptor or the electron donor compound is reacting with the photosensitizer in its excited state, it is preferred that the reaction be exothermic or only slightly endothermic. When the electron acceptor or the electron donor compound is reacting with the photosensitizer ion radical, exothermic reactions are still preferred, but still more endothermic reactions can be expected in many instances to occur. Thus, the reduction potential of the photosensitizer can be 0.2 V or more, more negative than that of a second-to-react electron acceptor, or the oxidation potential of the photosensitizer can be 0.2 V or more, more positive than that of a second-to-react electron donor compound.

Suitable electron donor compounds include, for example, those described by D. F. Eaton in *Advances in Photochemistry*, edited by B. Voman et al., Volume 13, pp. 427-488, John Wiley and Sons, New York (1986); U.S. Pat. Nos. 6,025,406, and 5,545,676. Such electron donor compounds include amines (including triethanolamine, hydrazine, 1,4-diazabicyclo[2.2.2]octane, triphenylamine (and its triphenylphosphine and triphenylarsine analogs), aminoaldehydes, and aminosilanes), amides (including phosphoramides), ethers (including thioethers), ureas (including thioureas), sulfinic acids and their salts, salts of ferrocyanide, ascorbic acid and its salts, dithiocarbamic acid and its salts, salts of xanthates, salts of ethylene diamine tetraacetic acid, salts of (alkyl)$_n$(aryl)$_m$borates (n+m=4) (tetraalkylammonium salts preferred), various organometallic compounds such as SnR$_4$ compounds (where each R is independently chosen from among alkyl, aralkyl (particularly, benzyl), aryl, and alkaryl groups) (for example, such compounds as n-C$_3$H$_7$Sn(CH$_3$)$_3$, (allyl)Sn(CH$_3$)$_3$, and (benzyl)Sn(n-C$_3$H$_7$)$_3$), ferrocene, and the like, and mixtures thereof. The electron donor compound can be unsubstituted or can be substituted with one or more non-interfering substituents. Particularly preferred electron donor compounds contain an electron donor atom (such as a nitrogen, oxygen, phosphorus, or sulfur atom) and an abstractable hydrogen atom bonded to a carbon or silicon atom alpha to the electron donor atom.

Preferred amine electron donor compounds include alkyl-, aryl-, alkaryl- and aralkyl-amines (for example, methylamine, ethylamine, propylamine, butylamine, triethanolamine, amylamine, hexylamine, 2,4-dimethylaniline, 2,3-dimethylaniline, o-, m- and p-toluidine, benzylamine, aminopyridine, N,N'-dimethylethylenediamine, N,N'-diethylethylenediamine, N,N'-dibenzylethylenediamine, N,N'-diethyl-1,3-propanediamine, N,N'-diethyl-2-butene-1,4-diamine, N,N'-dimethyl-1,6-hexanediamine, piperazine, 4,4'-trimethylenedipiperidine, 4,4'-ethylenedipiperidine, p-N,N-dimethyl-aminophenethanol and p-N-dimethylaminobenzonitrile); aminoaldehydes (for example, p-N,N-dimethylaminobenzaldehyde, p-N,N-diethylaminobenzaldehyde, 9-julolidine carboxaldehyde, and 4-morpholinobenzaldehyde); and aminosilanes (for example, trimethylsilylmorpholine, trimethylsilylpiperidine, bis(dimethylamino)diphenylsilane, tris(dimethylamino)methylsilane, N,N-diethylaminotrimethylsilane, tris(dimethylamino)phenylsilane, tris(methylsilyl)amine, tris(dimethylsilyl)amine, bis(dimethylsilyl)amine, N,N-bis(dimethylsilyl)aniline, N-phenyl-N-dimethylsilylaniline, and N,N-dimethyl-N-dimethylsilylamine); and mixtures thereof. Tertiary aromatic alkylamines, particularly those having at least one electron-withdrawing group on the aromatic ring, have been found to provide especially good shelf stability. Good shelf stability has also been obtained using amines that are solids at room temperature. Good photographic speed has been obtained using amines that contain one or more julolidinyl moieties.

Preferred amide electron donor compounds include N,N-dimethylacetamide, N,N-diethylacetamide, N-methyl-N-phenylacetamide, hexamethylphosphoramide, hexaethylphosphoramide, hexapropylphosphoramide, trimorpholinophosphine oxide, tripiperidinophosphine oxide, and mixtures thereof.

Preferred alkylarylborate salts include

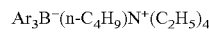

$Ar_3B^-(n-C_4H_9)N^+(C_2H_5)_4$

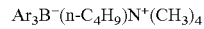

$Ar_3B^-(n-C_4H_9)N^+(CH_3)_4$

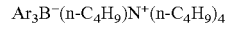

$Ar_3B^-(n-C_4H_9)N^+(n-C_4H_9)_4$

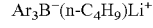

$Ar_3B^-(n-C_4H_9)Li^+$

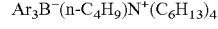

$Ar_3B^-(n-C_4H_9)N^+(C_6H_{13})_4$

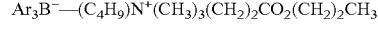

$Ar_3B^--(C_4H_9)N^+(CH_3)_3(CH_2)_2CO_2(CH_2)_2CH_3$

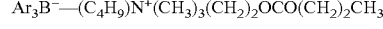

$Ar_3B^--(C_4H_9)N^+(CH_3)_3(CH_2)_2OCO(CH_2)_2CH_3$

$Ar_3B^--(sec-C_4H_9)N^+(CH_3)_3(CH_2)_2CO_2(CH_2)_2CH_3$

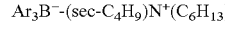

$Ar_3B^--(sec-C_4H_9)N^+(C_6H_{13})_4$

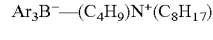

$Ar_3B^--(C_4H_9)N^+(C_8H_{17})_4$

$Ar_3B^--(C_4H_9)N^+(CH_3)_4$

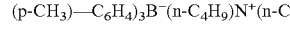

$(p-CH_3)-C_6H_4)_3B^-(n-C_4H_9)N^+(n-C_4H_9)_4$

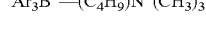

$Ar_3B^--(C_4H_9)N^+(CH_3)_3(CH_2)_2OH$

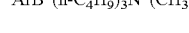

$ArB^-(n-C_4H_9)_3N^+(CH_3)_4$ $ArB^-(C_2H_5)_3N^+(CH_3)_4$ $Ar_2B^-(n-C_4H_9)_2N^+(CH_3)_4$ $Ar_3B^-(C_4H_9)N^+(C_4H_9)_4$ $Ar_4B^-N^+(C_4H_9)_4$ $ArB^-(CH_3)_3N^+(CH_3)_4$ $(n-C_4H_9)_4B^-N^+(CH_3)_4$ $Ar_3B^-(C_4H_9)P^+(C_4H_9)_4$ where Ar is phenyl, naphthyl, substituted (preferably, fluoro-substituted) phenyl, substituted naphthyl, and like groups having greater numbers of fused aromatic rings, as well as tetramethylammonium n-butyltriphenylborate and tetrabutylammonium n-hexyl-tris(3-fluorophenyl)borate (available under the trade designations CGI 437 and CGI 7460 from Ciba Specialty Chemicals Corporation), and mixtures thereof.

Suitable ether electron donor compounds include 4,4'-dimethoxybiphenyl, 1,2,4-trimethoxybenzene, 1,2,4,5-tetramethoxybenzene, and the like, and mixtures thereof. Suitable urea electron donor compounds include N,N'-dimethylurea, N,N-dimethylurea, N,N'-diphenylurea, tetramethylthiourea, tetraethylthiourea, tetra-n-butylthiourea, N,N-di-n-butylthiourea, N,N'-di-n-butylthiourea, N,N-diphenylthiourea, N,N'-diphenyl-N,N'-diethylthiourea, and the like, and mixtures thereof.

Preferred electron donor compounds for free radical-induced reactions include amines that contain one or more julolidinyl moieties, alkylarylborate salts, and salts of aromatic sulfinic acids. However, for such reactions, the electron donor compound can also be omitted, if desired (for example, to improve the shelf stability of the photoreactive composition or to modify resolution, contrast, and reciprocity). Preferred electron donor compounds for acid-induced reactions include 4-dimethylaminobenzoic acid, ethyl 4-dimethylaminobenzoate, 3-dimethylaminobenzoic acid, 4-dimethylaminobenzoin, 4-dimethylaminobenzaldehyde, 4-dimethylaminobenzonitrile, 4-dimethylaminophenethyl alcohol, and 1,2,4-trimethoxybenzene.

It is within the scope of this invention that either the electron donor, the electron acceptor, or both can be covalently tethered to the multi-photon sensitizer.

Inorganic Particles

Particles suitable for use in the compositions of the invention are described, for example, in U.S. Pat. No. 5,648,407, the description of which is incorporated herein by reference. Suitable particles are micron or submicron in size, substantially inorganic in chemical composition, and if used at concentrations greater than about 10% by weight in the composition, largely transparent at the wavelength of light used for reaction of the multiphoton reactive composition. Such particles include but are not limited to metal oxides (such as $Al_2O_3$, $ZrO_2$, $TiO_2$, ZnO, $SiO_2$, and silicate glasses), metals, and metals alloys, as well as other sufficiently transparent non-oxide ceramic materials. An additional consideration in choosing the inorganic particle(s) can be the temperature at which the material can be sintered into a dense inorganic structure.

Colloidal silica is the preferred particle for use in the invention, but other colloidal metal oxides (for example, titania, alumina, zirconia, vanadia, antimony oxide, tin oxide, and mixtures thereof) can also be utilized. The colloidal particles can include essentially a single oxide with sufficient transparency, such as silica, or can include a core of an oxide of one type (or a core of a material other than a metal oxide) on which is deposited an oxide of another type, preferably silica. Alternatively colloidal particles can be composed of clusters of smaller particles. Generally, the particles or clusters are smaller than the wavelength of light used for photopatterning the composition and can range in size (average particle diameter) from about 10 nanometers to about 10 micron, preferably from about 10 nanometers to about 500 nanometers, more preferably from about 10 nanometers to about 150 nanometers. Incorporation of colloidal particles having the specified size range into the photoreactive composition yields a substantially clear, homogeneous composition. Such compositions minimize scattering of light during the photopatterning process.

Small amounts of other types of particles can be added to the compositions in order to impart additional properties and/or function to the fabricated structure. Such particles include, but are not limited to, absorbing particles; particles with magnetic, dielectric, insulating, piezoelectric, ferroelectric, photochromic, refractory, chemically active, biocompatible, or luminescent properties; and particles for enhancing mechanical strength and toughness. Examples of such functional ceramic particles include $MnFe_2O_4$, $SmCoO_5$, NdFeB, $PbZr_{0.5}Ti_{0.5}O_3$, $BaFe_{12}O_{19}$, $BaTiO_3$, $SrTiO_3$, $MoO_3$, $WO_3$, SiC, $Si_3N_4$, $MoS_2$, $Fe_2O_3$, $Fe_3O_4$, $BaZrO_3$, $WO_2$, $CrO_2$, $Cr_2O_3$, $MoO_2$ and $Ca_5(PO_4)_3OH$. Ceramic particles can be obtained commercially (for example, from TPL (Technologies to Products), Albuquerque, N. Mex.; Materials Modification, Inc., Fairfax, Va.; and Nanophase Technologies Corporation, Burr Bridge, Ill.) or fabricated using techniques known to those skilled in the art and/or described in the pertinent texts and literature (see, for example, R. A. Andrievsky, "State-of-the-art and perspectives in the field of particulate nanostructured materials," J. Mater Sci. Technol. 14, 97 (1988)). Other useful non-ceramic particles include magnetic metals and metal alloys including Co, CoPt intermetallics ($CoPt_3$, CoPt, $Co_3Pt$), FePt intermetallics ($Fe_3Pt$, FePt, and $FePt_3$), CoNi, NiFe, CoFe and ternary alloys of Co/Fe/Ni. The magnetic metal or metal alloy particles can have a shell of a second material such as silver to protect them from oxidation. Such magnetic particles can be prepared for example using techniques described in European Patent Application No. EP 0,977,212 A.

It will be apparent to one skilled in the art that certain types of inorganic particles can interact with components of the multiphoton photoinitiator system (for example acting as an electron acceptor) and interfere with the multiphoton-photoinitiated photoreaction. Therefore the combination of the particular inorganic particles and the multiphoton photoinitiators can preferably be chosen to avoid such interference.

It is also preferable that the colloidal particles be relatively uniform in size and remain substantially non-aggregated, as particle aggregation can result in precipitation, gellation, or a dramatic increase in sol viscosity. Photoreactive compositions including particles having a substantially monodisperse or a substantially bimodal size distribution are preferred. Thus, a particularly desirable class of particles for use in preparing the compositions of the invention include sols of inorganic particles (for example, colloidal dispersions of inorganic particles in liquid media), especially sols of amorphous silica. Such sols can be prepared by a variety of techniques and in a variety of forms, which include hydrosols (where water serves as the liquid medium), organosols (where organic liquids are used), and mixed sols (where the liquid medium includes both water and an organic liquid). See, for example, the descriptions of the techniques and forms given in U.S. Pat. Nos. 2,801,185 (Iler) and 4,522,958 (Das et al.), which descriptions are incorporated herein by reference, as well as those given by R. K. Iler in *The Chemistry of Silica*, John Wiley & Sons, New York (1979).

Due to their surface chemistry and commercial availability, silica hydrosols are preferred for use in preparing the compositions of the invention. Such hydrosols are available in a variety of particle sizes and concentrations from, for example, Nyacol Products, Inc. in Ashland, Md.; Nalco Chemical Company in Oakbrook, Ill.; and E. I. duPont de Nemours and Company in Wilmington, Del. Concentrations from about 10 to about 50 percent by weight of silica in water are generally useful, with concentrations of from about 30 to about 50 weight percent being preferred (as there is less water to be removed). If desired, silica hydrosols can be prepared, for example, by partially neutralizing an aqueous solution of an alkali metal silicate with acid to a pH of about 8 or 9 (such that the resulting sodium content of the solution is less than about 1 percent by weight based on sodium oxide). Other methods of preparing silica hydrosols, for example, electrodialysis, ion exchange of sodium silicate, hydrolysis of silicon compounds, and dissolution of elemental silicon are described by Iler, supra.

Preparation of the reactive resin sol generally requires that at least a portion of the surface of the inorganic particles be modified so as to aid in the dispersibility of the particles in the resin. This surface modification can be effected by various different methods which are known in the art. (See, for example, the surface modification techniques described in U.S. Pat. Nos. 2,801,185 (Iler) and 4,522,958 (Das et al.), which descriptions are incorporated herein by reference).

For example, silica particles can be treated with monohydric alcohols, polyols, or mixtures thereof (preferably, a saturated primary alcohol) under conditions such that silanol groups on the surface of the particles chemically bond with hydroxyl groups to produce surface-bonded ester groups. The surface of silica (or other metal oxide) particles can also be treated with organosilanes, for example, alkyl chlorosilanes, trialkoxy arylsilanes, or trialkoxy alkylsilanes, or with other chemical compounds, for example, organotitanates, which are capable of attaching to the surface of the particles by a chemical bond (covalent or ionic) or by a strong physical bond, and which are chemically compatible with the chosen resin(s). Treatment with organosilanes is generally preferred. When aromatic ring-containing epoxy resins are utilized, surface treatment agents which also contain at least one aromatic ring are generally compatible with the resin and are thus preferred. Similarly other metal oxides can be treated with organic acids, (for example, oleic acid), or the organic acid can be incorporated into the composition as a dispersant.

In preparing the reactive resin sols, a hydrosol (for example, a silica hydrosol) can generally be combined with a water-miscible organic liquid (for example, an alcohol, ether, amide, ketone, or nitrile) and, optionally (if alcohol is used as the organic liquid), a surface treatment agent such as an organosilane or organotitanate. Alcohol and/or the surface treatment agent can generally be used in an amount such that at least a portion of the surface of the particles is modified sufficiently to enable the formation of a stable reactive resin sol (upon combination with reactive resin). Preferably, the amount of alcohol and/or treatment agent is selected so as to provide particles which are at least about 50 weight percent metal oxide (for example, silica), more preferably, at least about 75 weight percent metal oxide. (Alcohol can be added in an amount sufficient for the alcohol to serve as both diluent and treatment agent.) The resulting mixture can then be heated to remove water by distillation or by azeotropic distillation and can then be maintained at a temperature of, for example, about 100° C. for a period of, for example, about 24 hours to enable the reaction (or other interaction) of the alcohol and/or other surface treatment agent with chemical groups on the surface of the particles. This provides an organosol comprising particles which have surface-attached or surface-bonded organic groups (also referred to herein as "substantially inorganic" particles).

The resulting organosol can then be combined with a reactive resin and the organic liquid removed by, for example, using a rotary evaporator. Preferably, the organic liquid is removed by heating under vacuum to a temperature sufficient to remove even tightly-bound volatile components. Stripping times and temperatures can generally be selected so as to maximize removal of volatiles while minimizing advancement of the resin. Alternatively, methods known in the art such as ball milling, 3-roll milling, Brabender mixing, extruding or any other high shear mixing process can be used to mix the inorganic particles with the reactive species.

Preparation of Multi-photon Reactive Composition

The reactive and optionally non-reactive species, inorganic particles, multi-photon photosensitizers, electron donor compounds, and electron acceptors can be prepared by the methods described above or by other methods known in the art, and many are commercially available. These components can be combined under "safe light" conditions using any order and manner of combination (optionally, with stirring or agitation), although it is sometimes preferable (from a shelf life and thermal stability standpoint) to add the electron acceptor last (and after any heating step that is optionally used to facilitate dissolution of other components). Solvent can be used, if desired, provided that the solvent is chosen so as to not react appreciably with the components of the composition. Suitable solvents include, for example, acetone, dichloroethane, and acetonitrile. The reactive species itself can also sometimes serve as a solvent for the other components.

The components of the multi-photon photoinitiator system are present in photochemically effective amounts (as defined above). Generally, the multi-photon reactive composition contains from about 5% to about 99.79% by weight of one or more reactive species from about 0.01% to about 10% by weight of one or more photosensitizers (preferably, from about 0.1% to about 5%; more preferably, from about 0.2% to about 2%); up to about 10% by weight of one or more electron donor compounds (preferably, from about 0.1% to about 10%; more preferably, from about 0.1% to about 5%); and from about 0.1% to about 10% by weight of one or more electron acceptors (preferably, from about 0.1% to about 5%) based upon the total weight of solids in the composition (that is, the total weight of components other than solvent).

The photoreactive composition is loaded with between 0.01% and 75% by volume of inorganic particles.

A wide variety of additives can be included in the multi-photon reactive compositions, depending upon the desired end use. Suitable additives include solvents, diluents, resins, binders, plasticizers, pigments, dyes, thixotropic agents, indicators, inhibitors, stabilizers, ultraviolet absorbers, medicaments (for example, leachable fluorides), and the like. The amounts and types of such additives and their manner of addition to the compositions will be familiar to those skilled in the art.

It is within the scope of this invention to include nonreactive polymeric binders in the compositions in order, for example, to control viscosity and to provide film-forming properties. Such polymeric binders can generally be chosen to be compatible with the reactive species. For example, polymeric binders that are soluble in the same solvent that is used for the reactive species, and that are free of functional groups that can adversely affect the course of reaction of the reactive species, can be utilized. Binders can be of a molecular weight suitable to achieve desired film-forming properties and solution rheology (for example, molecular weights between about 5,000 and 1,000,000 daltons; preferably between about 10,000 and 500,000 daltons; more preferably, between about 15,000 and 250,000 daltons). Suitable polymeric binders include, for example, polystyrene, poly(methyl methacrylate), poly(styrene)-co-(acrylonitrile), cellulose acetate butyrate, and the like. Suitable nonreactive polymeric binders, if present, can be included in the compositions up to 90%; preferably up to 75%; more preferably up to 60% by weight of the total composition.

Prior to exposure, the multiphoton reactive compositions can be applied on a substrate, if desired, by any of a variety of application methods. The compositions can be applied by coating methods such as spin, knife, bar, reverse roll, and knurled roll coating, or by application methods such as dipping, immersion, spraying, brushing, curtain coating and the like. Alternatively, the composition can be applied drop-wise. The substrate can be made of any suitable material (e.g., glass, fused silica, or silicon) and can be chosen from a wide variety of films, sheets, and other surfaces, depending upon the particular application and the method of exposure to be utilized.

EXAMPLES

Unless otherwise noted, chemicals used in the examples were commercially available from Aldrich Chemical Co., Milwaukee, Wis. Borate salt was commercially available from Ciba Specialty Chemicals, Tarrytown, N.Y. under the trade designation CGI 7460. Diaryliodonium hexafluoroantimonate salt was commercially available from Sartomer Company, West Chester, Pa. under the trade designation CD1012. All preparations were performed under safe lights to prevent premature curing of the compositions.

Preparatory Example 1

The two-photon sensitizing dye, bis-[4-(diphenylamino)stryl]-1-(2-ethylhexyloxy),4-(methoxy)benzene was prepared as follows:

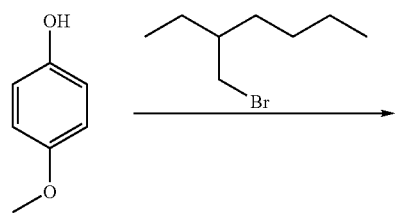

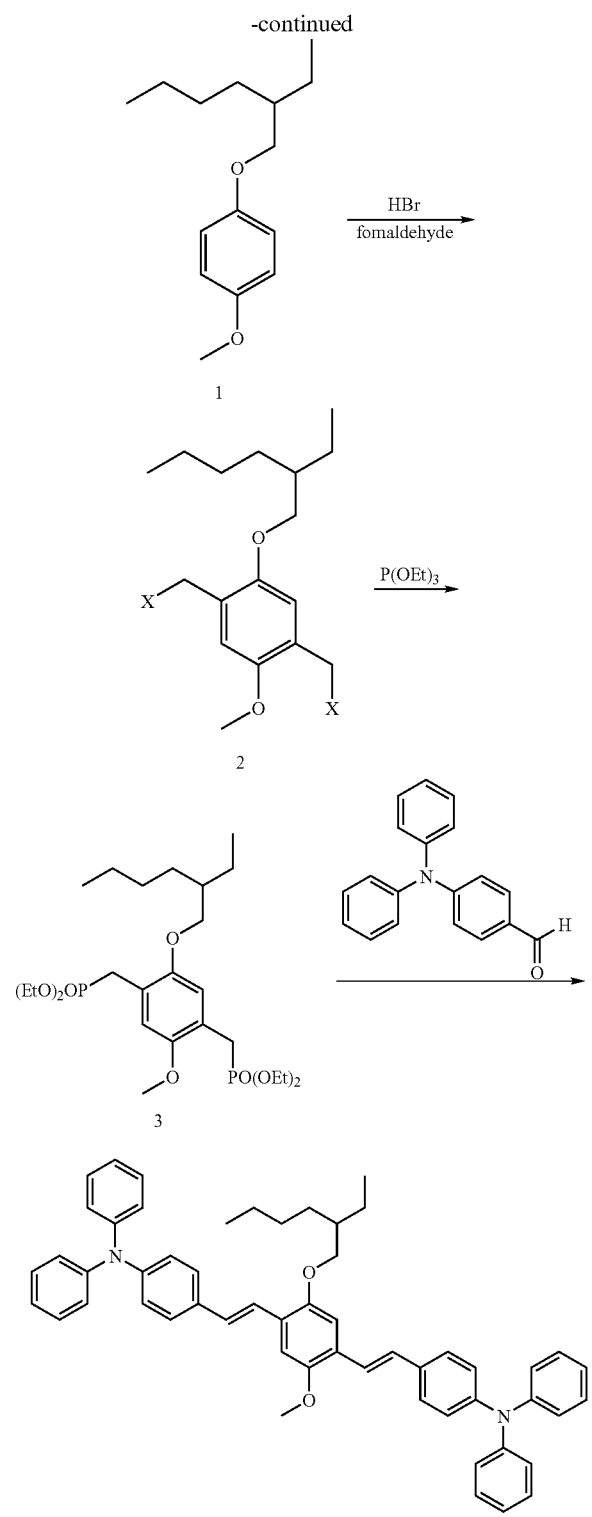

1-methoxy-4-(2-ethylhexyloxy)benzene (1)

A mixture of 4-methoxyphenol (100.0 g, 0.8 mol), dry potassium carbonate (166.7 g, 1.2 mol), acetonitrile (800 mL), and 2-ethylhexyl bromide (173.8 g, 0.9 mol) was stirred mechanically and heated at reflux for 4 days. After cooling, the mixture was diluted with water (1.5 L), and then the organic phase was separated. The aqueous layer was extracted with hexane, and the combined organic layers were washed two times with 1.0 M NaOH and water. After drying over MgSO$_4$, the solvent was removed under reduced pressure to give an orange oil. The crude product was distilled under reduced pressure to give 152 g (80%) of a clear oil. (bp 135-138° C. at 0.4 mmHg).

2,5-bis(bromomethyl)-1-methoxy-4-(2-ethylhexyloxy) benzene (2)

A mixture of 1-methoxy-4-(2-ethylhexyloxy)benzene (50.0 g, 0.21 mol), paraformaldehyde (30.0 g, 1 mol), acetic acid (100 mL), and HBr (30% in acetic acid, 100 mL) was heated to 70° C. The reaction exothermed to 80° C. and the paraformaldehyde dissolved completely to give an orange solution. After 4 h at 70° C., the reaction was cooled to room temperature. The mixture was diluted with methylene chloride (500 mL), and the organic layer was washed three times with water and once with saturated NaHCO$_3$. After drying over MgSO$_4$, the solvent was removed under vacuum. A pale yellow solid was obtained which was recrystallized from hexane to give a yellow/white powder (71.6 g, 81%).

Alternatively: 2,5-bis(choloromethyl)-1-methoxy-4-(2-ethylhexyloxy)benzene can be synthesized according to procedures in U.S. Pat. No. 5,189,136.

Phosphine Derivative (3)

A mixture of 2,5-bis(chloromethyl)-1-methoxy-4-(2-ethylhexyloxy)benzene (28.26 g, 85 mmol) and triethyl phosphite (37.4 g, 0.23 mol) was heated to reflux for 6 h. After cooling, the product was heated under high vacuum to remove residual triethylphosphite. A thick oil was obtained which slowly crystallized after several days and was used without further purification in the following step.

Bis-[4-(diphenylamino)stryl]-1-(2-ethylhexyloxy),4-(methoxy)benzene (4)

To a mixture of phosphine derivative (3) (11.60 g, 21.7 mmol), 4-diphenylaminobenzaldehyde (12.34 g, 45.1 mmol), and dry tetrahydrofuran (400 mL) was added dropwise potassium t-butoxide (1.0 M in tetrahydrofuran, 44 mL, 44 mmol). The mixture was stirred for 3 hours at room temperature, then the solvent was removed under vacuum. Water (100 mL) was added to the residue, and the mixture was extracted several times with methylene chloride. The combined organic layers were washed with brine, dried over MgSO$_4$ and the solvent was removed under vacuum. The crude product was purified by column chromatography on silica gel using 30/70 methylene chloride/hexane to give a bright green solid (14.44 g, 86%).

Preparatory Example 2

Preparation of the silica-epoxy sol is described. 100 g of NALCO 2327 (approximately 41% aqueous dispersion) from Ondeo Nalco (Naperville, Ill.) was placed in a round bottom flask. A premixed solution of 225 grams of 1-methoxy-2-propanol and 5.04 grams of trimethoxyphenylsilane (0.62 mmols of silane per gram of silica) was added under medium agitation over a period of 5-10 minutes. The resulting non-agglomerated solution was heated at 90-95° C. for approximately 22 hours and then dried to yield a white, powder. The treated silica was added to de-ionized water (100 g silica to 300 g of water), vigorously stirred for 3-4 hours, and then allowed to sit at room temperature overnight. The silica was filtered off, washed well with additional rinses of de-ionized water, and dried.

The treated silica was dispersed in acetone (20-25% solids) using a high shear Silverson L4R mixer set at ¾ speed for 5 minutes. The resulting dispersion was covered and allowed to sit for a minimum of two hours. The dispersion was filtered through one micron Gelman acrodisc, 25 mm glass fiber syringe filters, and the percent silica solids determined.

A sample of the above silica/acetone mixture containing 10 g of silica was added to 4.87 g of cycloaliphatic epoxy resin available from Dow Chemical (Midland, Mich.) under the trade designation ERL-422 1, mixed well and vacuum stripped while slowly heating using a rotary evaporator and oil bath and maintained at a final stripping temperature of 130° C. for 30 minutes. 0.26 grams of 1,4 butanediol and 1.54 g of HELOXY 107 (Shell Chemical) were then added to this high viscosity mixture and mixed for 5 minutes at 3000 rpm using a FlackTek Inc. 150 FVZ speed mixer to give a silica-epoxy sol containing 60% silica by weight.

Example 3

7.5 g of the silica-epoxy sol prepared in Example 2 was combined with a solution of 0.075 g of CD1012 and 0.036 g of Bis-[4-(diphenylamino)stryl]-1-(2-ethylhexyloxy),4-(methoxy)benzene (from example 1) dissolved in 0.25 g tetrahydrofuran (Burdick & Jackson, Muskegon, Mich.) and 1.0 g of 1,2-dichloroethane. The solution was speed mixed at 3000 rpm for 90 seconds using a FlackTek Inc. 150 FVZ speed mixer and then spin coated on to silicon wafer that had been pre-treated with 2-(3,4-epoxycyclohexyl)-ethyltrimethoxysilane (Gelest, Tullytown, Pa.). The coated wafers were then soft baked in an 80° C. oven for 30 minutes to remove the residual solvent. The uncured film thickness was approximately 60 microns.

Two-photon polymerization was performed using a diode pumped Ti:sapphire laser (Spectra-Physics) operating at a wavelength of 800 nm, pulse width 100 fs, pulse repetition rate of 80 MHz, and beam diameter of approximately 5 mm. The optical train consisted of low dispersion turning mirrors, a beam expander, an optical attenuator to vary the optical power, and a 60× microscope objective (NA 0.85) to focus the light into the sample. The average power delivered to the sample was 16 mW. The position of the microscope objective was adjusted to set the focal point at the resin/wafer interface. The substrate was moved underneath the focused beam at nominally 170 mm/min using a computer controlled, 3-axis stage to expose an array of 20 micron wide bars with 20 micron spacing. A second layer of perpendicular bars was exposed 15 microns above the first layer. Each individual bar was exposed by raster scanning the stage and moving over by one micron after each pass.

A second coated wafer was exposed at nominally 240 mm/min in a pattern to form a 3 layer pyramid-like structure. The dimensions of the bottom layer that was attached to the substrate was 0.25 mm by 0.25 mm. For each successive layer z-axis position was moved up by 15 microns and the length and width were adjusted to be 80% of the previous layer. Each layer was created by raster scanning the stage, moving over by one micron after each pass.

Following exposure, both wafers were baked on a 110° C. hot plate for 5 minutes and then the unreacted resin was removed by development in propylene glycol methyl ether acetate and isopropanol rinse. The samples were lightly coated with AuPd and examined using a scanning electron microscope. The developed nanocomposite lattice structures had good structural integrity. The undercuts were clearly visible and the width of the lines was within 10% of the specified target dimensions. The pyramid-like structures also showed good dimensional fidelity. A slight lip was observed on two-sides of each layer that was attributed to acceleration and deceleration of the stages during raster scanning.

Example 4

In this example, sintering of two-photon polymerized resins to form a completely inorganic three-dimensional structure is demonstrated. The lattice structures created in example 3 were heated in air at 1° C./min to 700° C., in a Vulcan furnace (Model #3-350 Degussa-Ney, Bloomfield, Conn.) maintained at 700° C. for 2 hours, and then slowly cooled to room temperature. They were then re-examined using a scanning electron microscope.

The three-dimensional lattice structure including the undercuts was observed to be intact.

Example 5

This example describes the fabrication of a polymer magnetic microactuator.

Resin Preparation:

SR9008 is a trifunctional acrylate ester available from Sartomer Company (West Chester, Pa.). SR368 is tris(2-hydroxyethyl) isocyanurate triacrylate that is commercially available from Sartomer Company (West Chester, Pa.). NANOCAT™ magnetic iron oxide is a free flowing powder of 40-60 nm diameter nanoparticles that is commercially available from Mach I (King of Prussia, Pa.).

Stock Solution A:

16.25% PMMA (120,000 g/mol, Aldrich), 19.0% of SR9008, 19.0% SR368, 0.25% Bis-[4-(diphenylamino) stryl]-1-(2-ethylhexyloxy),4-(methoxy)benzene (4), 0.5% CD1012, and 45% 1,2-dichloroethane by weight are combined and stirred until a homogeneous solution is obtained. This mixture is referred to as stock solution A.

Stock Solution B:

42% of SR9008, 42% SR368, 15% NANOCAT™, and 1% oleic acid (Aldrich) by weight are combined and then blended on a 3 roll mill until no large particulates are present and the resin appears transparent. The resulting mixture is referred to as stock solution B.

Stock Solution C

20% PMMA (120,000 g/mol, and 79.34% Aldrich), 0.66% Irgacure 819 (Ciba, Tarrytown, N.Y.) 1,2-dichloroethane by weight are combined and allowed to stir until the catalyst is thoroughly dispersed. 15 g of this solution is combined with 7 g of stock solution B and blended on a 3 roll mill until a homogenous mixture is obtained. The resulting solution is collected as stock solution C.

Spin Coating and Magnetization:

Thin silicon wafers are cleaned by soaking them for 10 minutes in a 3:1 mixture of sulfuric acid (98% solution) and hydrogen peroxide (30% solution in $H_2O$), followed by thorough rinsing with deionized water, rinsing again with isopropanol, and then blown dry. To promote adhesion of the curable composition to the silicon surface, the cleaned silicon wafers are dip coated in a 2% by weight solution of 3-(trimethoxysilyl)propyl methacrylate in slightly acidic (pH 4-5) aqueous ethanol (190 proof). The slides are rinsed briefly in anhydrous ethanol, cured for 10 minutes in a 130° C. oven, and then allowed to cool.

A portion of stock solution A is dispensed onto a primed silicon wafer and spin coated to form a uniform film, approximately 40 microns thick. The coated wafer is soft baked in an oven to remove the residual solvents (approximately 2 hours at 80° C.), and then cooled to room temperature. A portion of stock solution B is dispensed onto the dried, coated, wafer and spin coated to form a second layer approximately 10 microns thick on top of the first layer. The wafer is then soft baked again in an oven to remove the residual solvents and remove stresses in the film.

The coated wafer is then placed between the poles of a permanent magnet such that the magnetic field lines are parallel to the substrate. The assembly is placed in a 50° C. oven for 24 hours to allow the magnetic nanoparticles to align with the field and then cooled to room temperature. The coated wafer is then removed for the assembly. The permanent magnet has a magnetic field strength of at least 0.5 Tesla and an operating temperature of at least 80° C.

Exposure:

Two-photon polymerization is performed using a tunable diode pumped Ti:sapphire laser (Spectra-Physics) operating at a wavelength of 800 nm, pulse width 100 fs, pulse repetition rate of 80 MHz, beam diameter of approximately 5 mm. The optical train consists of low dispersion turning mirrors, a beam expander, an optical attenuator to vary the optical power, and a 100× oil immersion microscope objective (NA 1.25) to focus the light into the sample. The average power delivered to the sample is 1.5 mW. The position of the microscope objective is adjusted to set the focal point at the resin/wafer interface. Referring to FIGS. 3A-3B, the coated wafer is moved underneath the focused beam at 50 mm/min using a computer controlled, 3-axis stage to form the body 505, flexible prongs 518 and 520, and extension region 512. The height of the body is 40 microns. The laser output is then tuned to 755 nm and the average power adjusted to approximately 50 mW. The substrate is moved under the focused beam at 10 mm/min to form the cured structure 517. The height of the cured region 517 is 10 microns. The exposed wafer is then developed in propylene glycol methyl ether acetate and allowed to dry slowly at room temperature.

The wafer and microstructure are placed on top of an electromagnet and aligned so that the microstructure 500 is approximately aligned in the center. The microactuator is observed under a microscope as the current supplied to the electromagnet is slowly increased. The flexible prongs 518 and 520, and extension region 512, are observed to deflect out of plane as the current is increased. The electromagnet is removed and a permanent bar magnet is slowly brought close to the undersurface of the wafer. The microactuator is observed under a microscope as one pole of the bar magnet approaches the bottom of the wafer. The flexible prongs 518 and 520, and extension region 512, are observed to deflect in and out of plane as the magnet is moved to and away from the structure.

A number of embodiments of the invention have been described. Nevertheless, it will be understood that various modifications can be made without departing from the spirit and scope of the invention. Accordingly, other embodiments are within the scope of the following claims.

What is claimed is:

1. A multi-photon reactive composition comprising:
   (a) a multi-photon photoinitiator system comprising a multi-photon photosensitizer and an electron acceptor;
   (b) at least one organic reactive species which when exposed to multi-photon reactive radiation in the presence of the multi-photon photoinitiator system will produce a material having solubility characteristics different from those of the unexposed reactive species; and (c) a plurality of substantially inorganic particles, wherein the inorganic particles in the composition are submicron in size and are sufficiently transparent to the multi-photon reactive radiation to enable formation of material having such different solubility characteristics.

2. The multi-photon reactive composition of claim 1, wherein the inorganic particles in the composition are substantially monodisperse in size.

3. The multi-photon reactive composition of claim 1, wherein the inorganic particles in the composition are substantially bimodal in size distribution.

4. The multi-photon reactive composition of claim 1, wherein the particles have been surface treated.

5. The multi-photon reactive composition of claim 4, wherein the surface treatment is selected from the group consisting of silanization, plasma treatment, Corona treatment, organic acid, hydrolysis, coating, and titanation.

6. The multi-photon reactive composition of claim 1, wherein the system further comprises an electron donor.

7. The multi-photon reactive composition of claim 6, wherein the electron donor is selected from the group consisting of amines, amides, ethers, ureas, sulfinic acids and their salts, salts of ferrocyanide, ascorbic acid and its salts, dithiocarbamic acid and its salts, salts of xanthates, salts of ethylene diamine tetraacetic acid, salts of $(alkyl)_n(aryl)_m$borates (n+m=4), $SnR_4$ compounds, where each R is independently chosen from among alkyl, aralkyl, aryl, and alkaryl groups, ferrocene, and mixtures thereof.

8. The multi-photon reactive composition of claim 1, wherein the multi-photon photosensitizer has a two-photon absorption cross-section greater than that of fluorescein.

9. The multi-photon reactive composition of claim 1, wherein the multi-photon photosensitizer has a two-photon absorption cross-section at least 1.5 times greater than that of fluorescein.

10. The multi-photon reactive composition of claim 1, wherein the photosensitizer is capable of sensitizing 2-methyl-4,6-bis(trichloromethyl)-s-triazine under continuous irradiation in a wavelength range that overlaps the single photon absorption spectrum of the photosensitizer using the test procedure described in U.S. Pat. No. 3,729,313.

11. The multi-photon reactive composition of claim 1, wherein the photosensitizer is selected from Rhodamine B; molecules in which two donors are connected to a conjugated π (pi)-electron bridge; molecules in which two donors are connected to a conjugated π (pi)-electron bridge which is substituted with one or more electron accepting groups; molecules in which two acceptors are connected to a conjugated π (pi)-electron bridge; and molecules in which two acceptors are connected to a conjugated π (pi)-electron bridge which is substituted with one or more electron donating groups.

12. The multi-photon reactive composition of claim 1, wherein the photosensitizer is Rhodamine B.

13. The multi-photon reactive composition of claim 1, wherein the particles comprise a metal oxide, a metal, a metal alloy, or a non-oxide ceramic material.

14. The multi-photon reactive composition of claim 1, wherein the reactive species when exposed to multi-photon reactive radiation in the presence of the multi-photon photoinitiator system will produce a material having reduced solubility characteristics compared to the unexposed reactive species.

15. The multi-photon reactive compositioq of claim 1, wherein the reactive species when exposed to multi-photon reactive radiation in the presence of the multi-photon photoinitiator system will produce a polymerized material.

16. The multi-photon reactive composition of claim 1, wherein the reactive species when exposed to multi-photon reactive radiation in the presence of the multi-photon photoiniliator system will produce a crosslinked material.

17. A multi-photon reactive composition comprising:
(a) at least one reactive species selected from the group consisting of acrylates, methacrylates, styrenes, epoxies, vinyl ethers, cyanate esters, and mixtures thereof;
(b) a multi-photon photoinitiator system comprising a multi-photon photosensitizer and an electron acceptor; and
(c) a plurality of substantially inorganic particles, wherein the inorganic particles in the composition are submicron in size and are sufficiently transparent to multi-photon reactive radiation in the presence of the multi-photon photoinitiator system to enable formation of material having solubiity characteristics different from those of the unexposed reactive species.

18. A multi-photon reactive composition comprising:
(a) a multi-photon photoinitiator system comprising a multi-photon photosensitizer and an electron acceptor selected from the group consisting of iodonium salts, chloromethylated triazines, diazonium salts, sulfonium salts, azinium salts, triarylimidazolyl dimers, and mixtures thereof;
(b) at least one organic reactive species which when exposed to multi-photon reactive radiation in the presence of the multi-photon photoinitiator system will produce a material having solubility characteristics different from those of the unexposed reactive species; and
(c) a plurality of substantially inorganic particles, wherein the inorganic particles in the composition are submicron in size and are safficiently transparent to multi-photon reactive radiation in the presence of the multi-photon photoinitiator system to enable formation of material having solubility characteristics different from those of the unexposed reactive species.

19. A multi-photon reactive composition comprising:
(a) a multi-photon photoinitiator system comprising a multi-photon photosensitizer and an electron acceptor;
(b) at least one organic reactive species which when exposed to multi-photon reactive radiation in the presence of the multi-photon photoinitiator system will produce a material having solubility characteristics different from those of the unexposed reactive species; and
(c) a plurality of substantially inorganic particles comprising a metal or metal oxide wherein the particles are selected from the group consisting of $BaTiO_3$, $BaZrO_3$, $SrTiO_3$, $WO_2$, $WO_3$, $Fe_2O_3$, $Fe_3O_4$, $MnFe_2O_4$, $PbZr_{0.5}Ti_{0.5}O_3$, $BaFe_{12}O_{19}$, $CrO_2$, $Cr_2O_3$, Co, $MoO_2$, $MoO_3$, $SmCoO_5$, and mixtures thereof; and the inorganic particles in the composition are submicron in size and sufficiently transparent to multi-photon reactive radiation in the presence of the multi-photon photoinitiator system to enable formation of material having solubility characteristics different from those of the unexposed reactive species.

20. A multi-photon reactive composition comprising:
(a) a multi-photon photoinitiator system comprising a multi-photon photosensitizer and an electron acceptor;

(b) at least one organic reactive species which when exposed to multi-photon reactive radiation in the presence of the multi-photon photoinitiator system will produce a material havina solubility characteristics different from those of the unexposed reactive species; and (c) a plurality of substantially inorganic particles, wherein the particles comprise metal oxide; and the inorganic patcles in the composition are submicron in size and sufficiently transparent to multi-photon reactive radiation in the presence of the multi-photon photoinitiator system to enable formation of material having solubility characteristics different from those of the unexposed reactive species.

21. A multi-photon reactive composition comprising:
(a) a multi-photon photoinitiator system comprising a multi-photon photosensitizer and an electron acceptor;
(b) at least one organic reactive species which when exposed to multi-photon reactive radiation in the presence of the multi-photon photoinitiator system will produce a material having solubility characteristics different from those of the unexposed reactive species; and
(c) a plurality of substantially inorganic particles comprising a metal oxide wherein the particles are selected from the group consisting of $Al_2O_3$, $ZrO_2$, $SiO_2$, and mixtures thereof; and the inorganic particles in the composition are submicron in size and sufficiently transparent to multi-photon reactive radiation in the presence of the multi-photon photoinitiator system to enable formation of material having solubility characteristics different from those of the unexposed reactive species.

22. A multi-photon reactive composition comprising:
(a) a multi-photon photoinitiator system comprising a multi-photon photosensitizer and an electron acceptor;
(b) at least one organic reactive species which when exposed to multi-photon reactive radiation in the presence of the multi-photon photoinitiator system will produce a material havins solubility characteristics different from those of the unexposed reactive species; and
(c) a plurality of substantially inorganic particles comprising a metal oxide wherein the particles are selected from the group consisting of $TiO_2$, ZnO and mixtures thereof; and the inorganic particles in the composition are submicron in size and sufficiently transparent to taulti-photon reactive radiation in the presence of the multi-photon photoinitiator system to enable formation of material having solubility characteristics different from those of the unexposed reactive species.

* * * * *

UNITED STATES PATENT AND TRADEMARK OFFICE
CERTIFICATE OF CORRECTION

| | |
|---|---|
| PATENT NO. | : 7,265,161 B2 |
| APPLICATION NO. | : 10/262927 |
| DATED | : September 4, 2007 |
| INVENTOR(S) | : Catherine A. Leatherdale |

It is certified that error appears in the above-identified patent and that said Letters Patent is hereby corrected as shown below:

Page 3 of 3 – List of References cited by applicant and considered by examiner (05/01/2007) - Delete "perspective" and insert -- perspectives --, therefor.

Column 25 – Line 48 - Delete "Iodonium" and insert -- iodonium --, therefor.

Column 30 – Line 62 (Approx.) - Delete "(p-CH3)-C6H4)3" and insert -- (p-CH3O-C6H4)3 --, therefor.

Column 37 – Line 22 - Delete "(choloromethyl)" and insert -- (chloromethyl) --, therefor.

Column 38 – Line 9 - Delete "ERL-422 1," and insert -- ERL-4221, --, therefor. (Consider Space)

Column 42 – Line 1 - In Claim 15, delete "compositioq" and insert -- composition --, therefor.

Column 42 – Line 7-8 - In Claim 16, delete "photoiniliator" and insert -- photoinitiator --, therefor.

Column 42 – Line 22 - In Claim 17, delete "solubiity" and insert -- solubility --, therefor.

Column 42 – Line 39 - In Claim 18, delete "safficiently" and insert -- sufficiently --, therefor.

Column 43 – Line 4 - In Claim 20, delete "havina" and insert -- having --, therefor.

Column 43 – Line 9 - In Claim 20, delete "patcles" and insert -- particles --, therefor.

Column 44 – Line 14 (Approx.) - In Claim 22, delete "havins" and insert -- having --, therefor.

UNITED STATES PATENT AND TRADEMARK OFFICE
CERTIFICATE OF CORRECTION

PATENT NO. : 7,265,161 B2
APPLICATION NO. : 10/262927
DATED : September 4, 2007
INVENTOR(S) : Catherine A. Leatherdale It is certified that error appears in the above-identified patent and that said Letters Patent is hereby corrected as shown below:

Column 44 – Line 22 - In Claim 22, delete "taulti-photon" and insert -- multi-photon --, therefor.

Signed and Sealed this

Fifteenth Day of April, 2008

JON W. DUDAS
*Director of the United States Patent and Trademark Office*